(12) United States Patent
Haneda

(10) Patent No.: US 10,164,623 B2
(45) Date of Patent: *Dec. 25, 2018

(54) CIRCUIT DEVICE, ELECTRONIC DEVICE, PHYSICAL QUANTITY SENSOR, AND VEHICLE

(71) Applicant: Seiko Epson Corporation, Tokyo (JP)

(72) Inventor: Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/842,093

(22) Filed: Dec. 14, 2017

(65) Prior Publication Data

US 2018/0115308 A1   Apr. 26, 2018

Related U.S. Application Data

(63) Continuation of application No. 15/656,449, filed on Jul. 21, 2017, now Pat. No. 9,876,492.

(30) Foreign Application Priority Data

Jul. 25, 2016   (JP) ................................ 2016-145094

(51) Int. Cl.
| H03M 1/50 | (2006.01) |
| H03K 5/24 | (2006.01) |
| H03K 5/26 | (2006.01) |
| G01C 5/00 | (2006.01) |
| G01C 19/5776 | (2012.01) |

(Continued)

(52) U.S. Cl.
CPC ................. *H03K 5/24* (2013.01); *H03K 5/26* (2013.01); *H03M 1/50* (2013.01); *G01C 5/005* (2013.01); *G01C 19/5776* (2013.01); *G05D 1/08* (2013.01); *H03K 2005/00032* (2013.01)

(58) Field of Classification Search
CPC ........ H03M 1/50; H03M 1/1245; H03M 1/46; H03M 1/00; H03K 5/249; H03K 9/08; H03K 5/22; H03K 5/26; H03K 5/14; H03F 3/45475; H03F 3/45071; G04F 10/04
USPC ........ 341/166, 155; 327/2, 3, 12, 50, 63, 64, 327/104, 77, 78, 141
See application file for complete search history.

(56) References Cited

U.S. PATENT DOCUMENTS

| 7,106,239 B1 | 9/2006 | Keskin |
| 7,274,221 B2 | 9/2007 | Kim |
| 7,916,064 B2 | 3/2011 | Lin et al. |

(Continued)

*Primary Examiner* — Jean B Jeanglaude
(74) *Attorney, Agent, or Firm* — Harness, Dickey & Pierce, P.L.C.

(57) ABSTRACT

A circuit device includes a comparator and a flag signal generation circuit. The comparator includes a first voltage-time conversion circuit to which at least a first input signal is input and which outputs a first time information signal, a second voltage-time conversion circuit to which at least a second input signal is input and which outputs a second time information signal, and a determination circuit that determines magnitude relation of the first input signal and the second input signal, based on the first time information signal and the second time information signal. The flag signal generation circuit generates a flag signal indicating that a voltage difference between the first input signal and the second input signal is a predetermined voltage or less, based on the first time information signal and the second time information signal.

20 Claims, 17 Drawing Sheets

(51) Int. Cl.
  *G05D 1/08* (2006.01)
  *H03K 5/00* (2006.01)

(56) References Cited

U.S. PATENT DOCUMENTS

| | | |
|---|---|---|
| 8,373,444 B2 | 2/2013 | Lee et al. |
| 8,519,690 B2 * | 8/2013 | Takahashi ............ H02M 3/157 |
| | | 323/283 |
| 8,957,712 B2 | 2/2015 | Tang et al. |

\* cited by examiner

CIRCUIT DEVICE, ELECTRONIC DEVICE, PHYSICAL QUANTITY SENSOR, AND VEHICLE

CROSS-REFERENCE TO RELATED APPLICATIONS

This application is a continuation of U.S. patent application Ser. No. 15/656,449, filed Jul. 21, 2017, which claims priority to Japanese Patent Application No. 2016-145094, filed Jul. 25, 2016, both of which are hereby expressly incorporated by reference herein in their entireties.

BACKGROUND

1. Technical Field

The present invention relates to a circuit device, an electronic device, a physical quantity sensor, a vehicle, or the like.

2. Related Art

A time-domain type comparator is known which converts an input voltage level into a time (for example, a delay time of a signal edge, a pulse width of a pulse signal, a period of a clock signal, or the like), and performs comparison of the input voltage level by comparison of the time.

For example, U.S. Pat. No. 8,373,444 discloses a time domain-type comparator, and a sequential comparison-type A/D converter using it. The time domain-type comparator of U.S. Pat. No. 8,373,444 includes first and second voltage-time conversion circuits to which first and second input voltages and clock signals are input, and compares the first and second input voltages by comparing delay times (first and second delay times) of the clock signals in the first and second voltage-time conversion circuits. The first voltage-time conversion circuit includes a plurality of delay stages, and each delay stage includes two stages of inverter. An N-type transistor is provided between a first-stage inverter and a ground, and a P-type transistor is provided between a second-stage inverter and a power supply. Then, a first input voltage is input to the N-type transistor, and a second input voltage is input to the P-type transistor. The second voltage-time conversion circuit has the same configuration, but the second input voltage is input to the N-type transistor and the first input voltage is input to the P-type transistor. With such a configuration, the magnitude relation of the first and second delay times are determined according to the magnitude relation of the first and second input voltages, and voltage comparison is possible.

In general, in a case where a voltage difference between a voltage input to a positive terminal of a comparator and a voltage input to a negative terminal is a predetermined voltage or less, determination accuracy of the comparator may be deteriorated.

SUMMARY

An advantage of some aspects of the invention is to provide a circuit device, an electronic device, a physical quantity sensor, a vehicle, and the like, which can suppress deterioration of determination accuracy of a comparator, even in a case where a voltage difference between input signals input to a comparator is a predetermined voltage or less.

The invention can be implemented as the following forms or embodiments.

An aspect of the invention relates to a circuit device including a comparator that performs a comparison operation of input signals; and a flag signal generation circuit that generates a flag signal used for controlling the comparison operation, in which the comparator includes a first voltage-time conversion circuit to which at least a first input signal is input and which outputs a first time information signal, a second voltage-time conversion circuit to which at least a second input signal is input and which outputs a second time information signal, and a determination circuit that determines magnitude relation of the first input signal and the second input signal, based on the first time information signal from the first voltage-time conversion circuit, and the second time information signal from the second voltage-time conversion circuit, and in which the flag signal generation circuit generates the flag signal indicating that a voltage difference between the first input signal and the second input signal is a predetermined voltage or less, based on the first time information signal and the second time information signal.

In the aspect of the invention, the first time information signal is obtained from the first input signal, and the second time information signal is obtained from the second input signal. The magnitude relation of the first input signal and the second input signal are determined, based on the first time information signal and the second time information signal. Further, a flag signal indicating that a voltage difference between the first input signal and the second input signal is a predetermined voltage or less, based on the first time information signal and the second time information signal.

Thus, even in a case where the voltage difference of the input signals which are input to the comparator is the predetermined voltage or less, it is possible to suppress deterioration of determination accuracy of the comparator.

In the aspect of the invention, the circuit device may include a control circuit that performs the comparison operation of the comparator a plurality of times in a case where the flag signal is active.

With this configuration, for example, in a case where the flag signal is active, a final comparison result is obtained by majority decision based on a plurality of comparison results obtained by performing the comparison operation a plurality of times, thereby suppressing deterioration of determination accuracy.

In the aspect of the invention, the circuit device may include an A/D conversion circuit including the comparator, and a control circuit that sets a conversion range by the A/D conversion circuit based on the flag signal.

This configuration makes it possible to improve the conversion accuracy when A/D conversion is performed by setting the conversion range depending on whether or not the voltage difference between the input signals input to the comparator is the predetermined voltage or less.

In the aspect of the invention, the flag signal generation circuit may generate the flag signal, based on the first time information signal, the second time information signal, a first delay signal obtained by delaying the first time information signal, and a second delay signal obtained by delaying the second time information signal.

With this configuration, it is possible to compare the magnitudes of the first input signal and the second input signal on the time axis to generate a flag signal.

In the aspect of the invention, the flag signal generation circuit may generate the flag signal, based on a first signal obtained by a logical product of the first time information signal and the second time information signal, and a second signal obtained by a logical sum of the first delay signal and the second delay signal.

With this configuration, it is possible to determine whether or not the signal level of the first time information signal or the second time information signal changes after a given delay time elapses, to generate a flag signal, and the like.

In the aspect of the invention, the flag signal generation circuit may include a latch circuit that latches the first signal based on the second signal.

With this configuration, the flag signal generation circuit can activate the flag signal in a case where the first signal is at a low level and the second signal is at a high level.

In the aspect of the invention, a control circuit that performs an end determination of the comparison operation of the comparator based on the second signal may be included.

With this configuration, it is possible to shorten the comparison time in the comparison operation.

In the aspect of the invention, the first voltage-time conversion circuit may output the first time information signal corresponding to a first delay time which is increased as the voltage of the first input signal is larger than the voltage of the second input signal, and the second voltage-time conversion circuit may output the second time information signal corresponding to a second delay time which is increased as the voltage of the second input signal is larger than the voltage of the first input signal.

With this configuration, it is possible to convert the input signal into a time information signal indicating the time of the length according to the magnitude of the voltage of the input signal.

In the aspect of the invention, the predetermined voltage may be a voltage corresponding to a dead zone of the comparison operation of the comparator.

With this configuration, in a case where a voltage difference between the first input signal and the second input signal corresponds to the dead zone of the comparator, it is possible to suppress deterioration of the determination accuracy of the comparator.

Another aspect of the invention relates to an electronic device including the circuit device.

Another aspect of the invention relates to a physical quantity sensor including the circuit device.

Another aspect of the invention relates to a vehicle including the circuit device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. It is to be noted that the embodiment described below does not unduly limit the contents of the invention described in the appended claims, and not all of the configurations described in the embodiment are necessarily indispensable as solutions of the invention.

1. Overview

Figure 1:
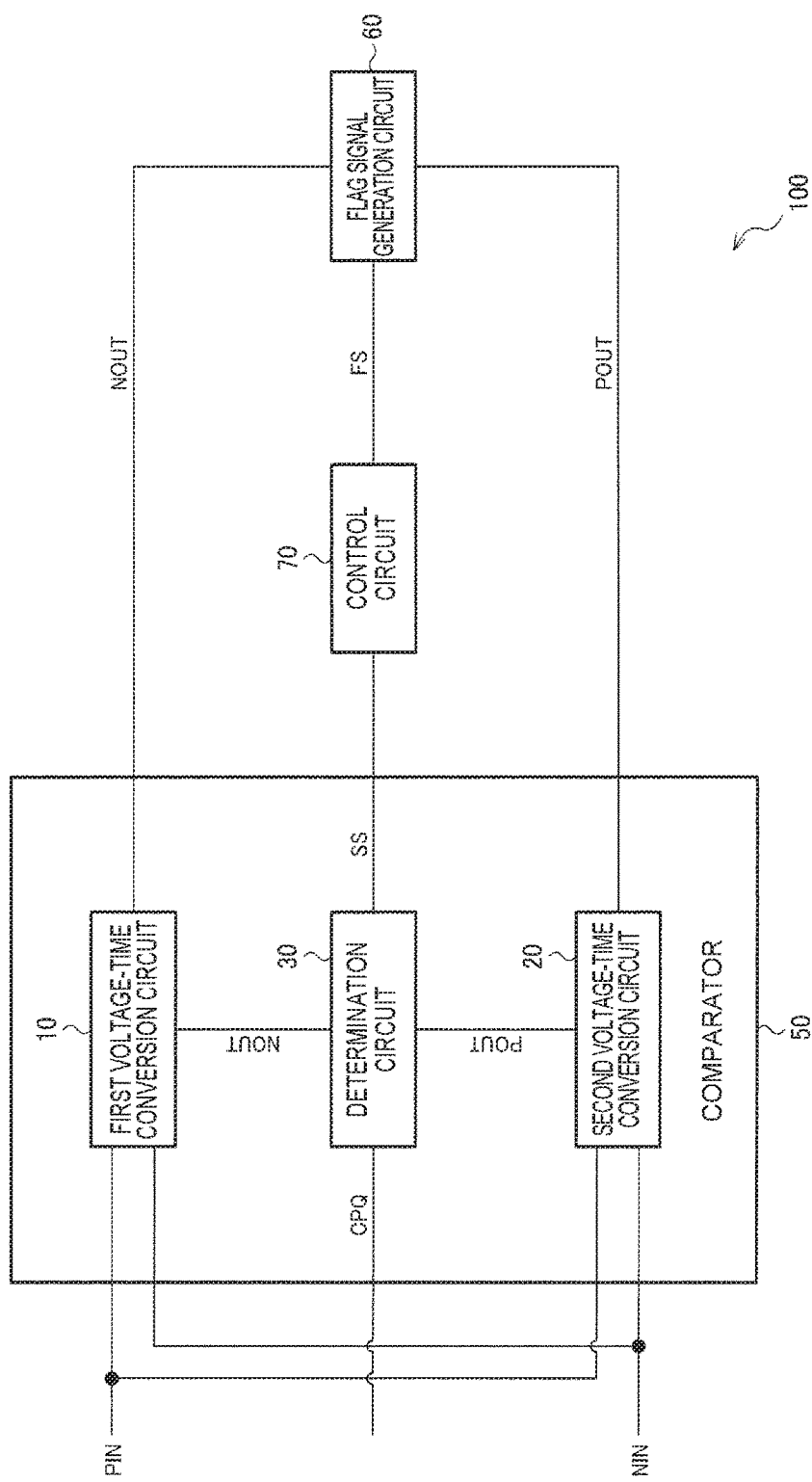
FIG. 1 shows a configuration example of a circuit device of the embodiment.

FIG. 1 shows a circuit configuration diagram of a circuit device 100 of the embodiment. The circuit device 100 of the embodiment includes a comparator 50 which performs a comparison operation of input signals, and a flag signal generation circuit 60 which generates a flag signal used for controlling the comparison operation.

The comparator 50 includes a first voltage-time conversion circuit 10, a second voltage-time conversion circuit 20, and a determination circuit 30.

The first voltage-time conversion circuit 10 receives at least a first input signal PIN and outputs a first time information signal NOUT. The second voltage-time conversion circuit 20 receives at least a second input signal NIN, and outputs a second time information signal POUT. The determination circuit 30 determines the magnitude relation of the first input signal PIN and the second input signal NIN, based on the first time information signal NOUT from the first voltage-time conversion circuit 10 and the second time information signal POUT from the second voltage-time conversion circuit 20. In addition, the conversion from the first voltage-time conversion circuit 10 to the first time information signal NOUT and the conversion from the second voltage-time conversion circuit 20 to the second time information signal POUT will be described later.

Further, the flag signal generation circuit 60 generates a flag signal FS indicating that a voltage difference between the first input signal PIN and the second input signal NIN is a predetermined voltage or less, based on the first time information signal NOUT and the second time information signal POUT.

As will be described later with reference to FIG. 17, in the comparator 50, there is a dead zone in which the determination accuracy is deteriorated when determining the magnitude relation of the input signals. Specifically, the dead zone is an area where the voltage difference between the first input signal PIN and the second input signal NIN input to the comparator 50 is the predetermined voltage or less. That is, in general, when the determination circuit of the comparator compares the magnitude of the first input signal PIN and the magnitude of the second input signal NIN, if the voltage difference between the first input signal PIN and the second input signal NIN is the predetermined voltage or less, the determination accuracy by the comparator may be deteriorated in some cases.

In contrast, in the circuit device 100 according to the embodiment, the flag signal generation circuit 60 generates a flag signal FS indicating that a voltage difference between the first input signal PIN and the second input signal NIN is the predetermined voltage or less, based on the first time information signal NOUT and the second time information signal POUT. Therefore, in a case where the flag signal FS is generated, as will be described later, the determination circuit 30 can perform an operation to improve the determination accuracy.

Thus, according to the embodiment, even in a case where the voltage difference of the input signals which are input to the comparator is the predetermined voltage or less, it is possible to suppress deterioration of determination accuracy of the comparator.

Figure 12:
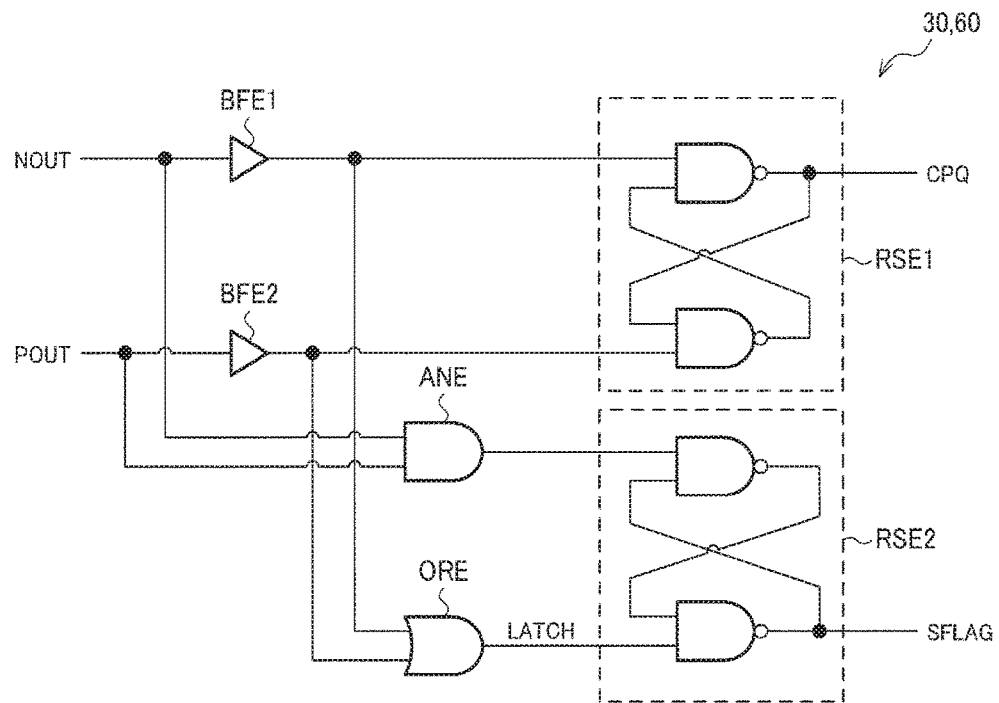
FIG. 12 is detailed configuration examples of a determination circuit and a flag signal generation circuit.

Further, in a case of determining whether or not a voltage difference of the input signal is minute, it is necessary to use a comparator with offset, for example. Therefore, there is a problem that power consumption increases. As will be described later, for example, in a successive comparison type A/D conversion circuit, an analog circuit portion such as a comparator consumes most of the power, and the power consumption is further increased. In the embodiment, power consumption is reduced by adopting a comparator of the type that converts the voltage to time (delay time). Since it is possible to determine whether or not the voltage difference of the input signal is minute by comparing the delay time, it can be determined by a digital process as shown in FIG. 12. This makes it possible to realize a minute signal determination with almost no increase in power consumption, with a simple circuit.

Further, the predetermined voltage is, for example, a voltage corresponding to the dead zone of the comparison operation of the comparator 50. The dead zone will be described in detail later using FIG. 17.

Figure 17:
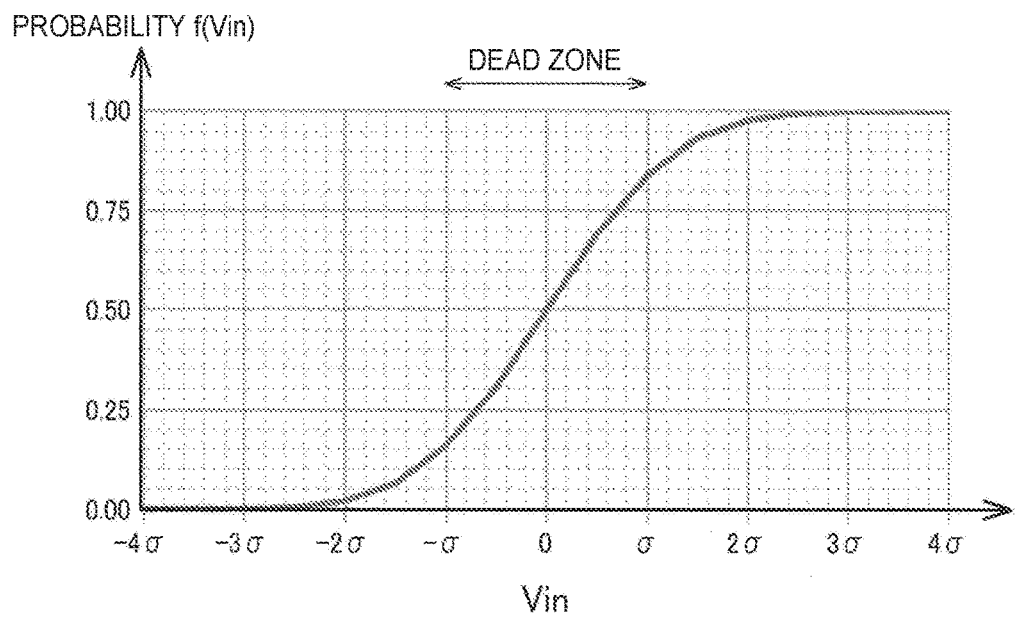
FIG. 17 shows a dead zone of the comparator.

Here, the voltage corresponding to the dead zone is, for example, the same voltage as the boundary of the dead zone as shown in FIG. 17, a predetermined voltage outside the dead zone, or the like. The predetermined voltage set outside the dead zone is, for example, a voltage set by the control circuit 70 to be described later according to the dead zone.

Thus, in a case where the voltage difference between the first input signal PIN and the second input signal NIN corresponds to the dead zone of the comparator 50, it is possible to suppress deterioration of determination accuracy of the comparator.

Next, the operation of the circuit device 100 in a case where the flag signal FS is generated will be described. For example, as shown in FIG. 1, the circuit device 100 of the embodiment includes a control circuit 70. Then, in a case where the flag signal FS is active, the control circuit 70 performs the comparison operation of the comparator 50 a plurality of times. In this case, for example, the control circuit 70 outputs the control signal SS for causing the comparison operation to be performed a plurality of times to the determination circuit 30, and the determination circuit 30 which obtains the control signal SS performs the comparison operation a plurality of times.

For example, in a case where the flag signal FS is active, the voltage difference between the first input signal PIN and the second input signal NIN is the predefined voltage or less and belongs to the dead zone as shown in FIG. 17 to be described later. As described above, in this case, as compared with the case where the input signal does not belong to the dead zone of the comparator 50, the determination accuracy of the magnitude relation of the input signals may be deteriorated.

In contrast, in the embodiment, in a case where the input signal belongs to the dead zone, the comparison operation of the first input signal PIN and the second input signal NIN is performed a plurality of times, and a final determination result is obtained, for example, by majority of a plurality of determination results. Therefore, for example, even if the magnitude relation of the input signals are erroneously compared in the first comparison operation, the number of correct determination results increases as the comparison operation is repeated, resulting in an improvement in the final determination accuracy.

In this way, in a case where the flag signal FS is active, a final comparison result is obtained by majority of a plurality of comparison results obtained by performing the comparison operation a plurality of times, thereby suppressing deterioration of determination accuracy.

In addition, the circuit device 100 of the embodiment includes an A/D conversion circuit having the comparator 50. For example, in the example of FIG. 18 to be described later, the shown circuit device 100 is the A/D conversion circuit itself.

Figure 18:
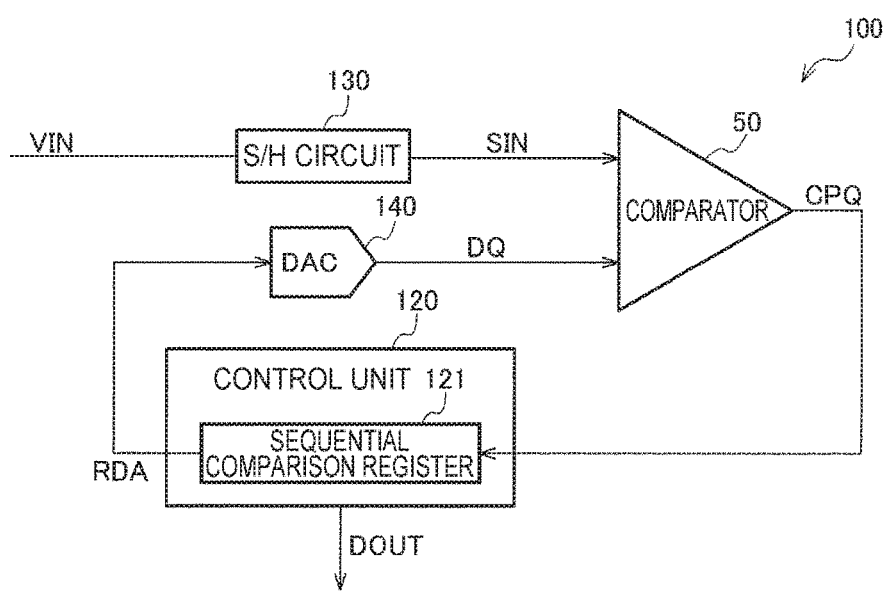
FIG. 18 shows another configuration example of the circuit device of the embodiment.

In the successive comparison type A/D conversion circuit as shown in FIG. 18, the comparator 50 sequentially compares the magnitudes of the input voltage VIN with the D/A conversion data DQ of the successive comparison data RD. In this case, the control unit 120 determines the successive comparison data RD such that the D/A conversion data DQ of the successive comparison data RD approaches the input voltage VIN gradually. In a case where such a successive comparison is performed, when the difference between the voltage DQ and the input voltage VIN is the predetermined voltage or less, it belongs to the dead zone as shown in FIG. 17, and the determination accuracy of the comparator 50 may be deteriorated in some cases. In the embodiment, in such a case, as described above, the comparison operation is performed a plurality of times.

In addition, in the example of FIG. 18, the control circuit 70 may set the conversion range by the A/D conversion circuit based on the flag signal FS. In the example of FIG. 18, the control circuit 70 corresponds to the control unit 120.

In the successive comparison type A/D conversion circuit, an upper limit and a lower limit of the successive comparison data RD are set in the register in each successive comparison, and a value between the upper limit and the lower limit (for example, the center of the upper limit and the lower limit) is input to a D/A conversion circuit 140 as comparison data. Then, the comparator 50 compares the D/A converted voltage DQ with the voltage SIN from a sample and hold circuit 130, and updates the upper limit and the lower limit based on the comparison result (a determination signal CPQ). The range between the upper limit and the lower limit is referred to as a conversion range. For example, in a case where the determination signal CPQ is at a high level, the lower limit is updated to comparison data; and in a case where the determination signal CPQ is at a low level, the upper limit is updated to comparison data. In this manner, the conversion range is sequentially reduced, and the voltage SIN is converted into the A/D conversion data DOUT. In the comparison operation of the comparator 50, the upper limit voltage and the lower limit voltage of the voltage of the input signal VIN are determined by the D/A conversion data DQ of the successive comparison data RD. Here, the range between the upper limit voltage and the lower limit voltage is referred to as a conversion range. At this time, as a result of performing the comparison operation as described above, a voltage difference between the upper limit voltage or the lower limit voltage of a conversion range of the voltages (the voltage DQ from the D/A conversion circuit 140 and the voltage SIN from the sample and hold circuit 130) compared by the comparator 50 and the voltage of the input signal may be the predetermined voltage or less and the flag signal may be active in some cases. In this case, an incorrect comparison result may be output with the probability shown in FIG. 17. For example, even though the true input voltage is slightly below the voltage DQ (the voltage corresponding to the comparison data), there is a possibility that the comparator 50 outputs the determination signal CPQ of a high level. Then, there is a possibility that the lower limit of the conversion range is updated to the comparison data, the true input voltage does not belong to the conversion range, and correct A/D conversion data is not obtained.

Therefore, in the embodiment, for example, in a case where the flag signal is active, the control circuit 70 may update the conversion range to a wider conversion range than in a case where the flag signal is inactive. Specifically, conversion range successive comparison data RD is determined such that a redundant range is added to change the upper limit voltage or the lower limit voltage defining the conversion range. For example, in a case where the determination signal CPQ is at a low level, when the flag signal is inactive, the upper limit is changed to comparison data; and when the flag signal is active, the upper limit is changed to a value larger than the comparison data. On the other hand, in a case where the determination signal CPQ is at a high level, when the flag signal is inactive, the lower limit is changed to comparison data; and when the flag signal is active, the lower limit is changed to a value smaller than the comparison data. In a case where a flag signal is generated in the comparison operation near the upper limit voltage, the successive comparison data RD is determined so as to raise the upper limit voltage upward. On the other hand, in a case where a flag signal is active in the comparison operation near the lower limit voltage, the successive comparison data RD is determined so as to lower the lower limit voltage downward.

Thus, even in a case where there is a possibility that the comparator 50 performs erroneous determination in the comparison operation, the redundant range is added in the update of the conversion range, thereby including the input voltage in the updated conversion range. Thus, it is possible to prevent the voltage difference between the upper limit voltage or the lower limit voltage of the conversion range and the voltage of the input signal from being the predetermined voltage or less. As a result, it is possible to avoid performing the comparison operation in the dead zone as shown in FIG. 17, and to improve the conversion accuracy when performing the A/D conversion.

2. Configuration of Comparator

A comparator in the related art is commonly a comparator (for example, a latch comparator, or the like) that directly compares voltages (without converting the voltage into another amount such as a time). When such a comparator attempts to determine a weak signal, a preamplifier is provided in front of the comparator to amplify an input signal, and the comparator compares the amplified signal. Since it is necessary to apply a bias current to the preamplifier and the comparator, power consumption increases.

For example, when the above comparator is applied to the sequential comparison A/D conversion circuit as illustrated later in FIG. 18, the comparator occupies most of the power consumption. In the sequential comparison, the comparator performs comparison of a minute voltage difference, by comparison of a bit close to LSB. Since the comparator has a dead band (a range of an input voltage where a high level or a low level is stochastically determined), the comparator performs comparison after the preamplifier amplifies the voltage such that the voltage difference becomes larger than the dead band. Therefore, the power consumption of the preamplifier tends to increase. In a case where the voltage difference to be compared by the comparator is large, the comparator is overspecified, but the preamplifier has to be designed according to the minimum voltage difference.

In the embodiment, in order to solve the above problem, a voltage-time conversion type comparator is adopted. That is, an input voltage is converted into time (a time difference in an edge) and comparison is made in that time domain. In this method, a comparator can be realized by a digital operation, so that a bias current is not necessary and low power consumption can be achieved. A comparator of the embodiment will be described below.

Figure 2:
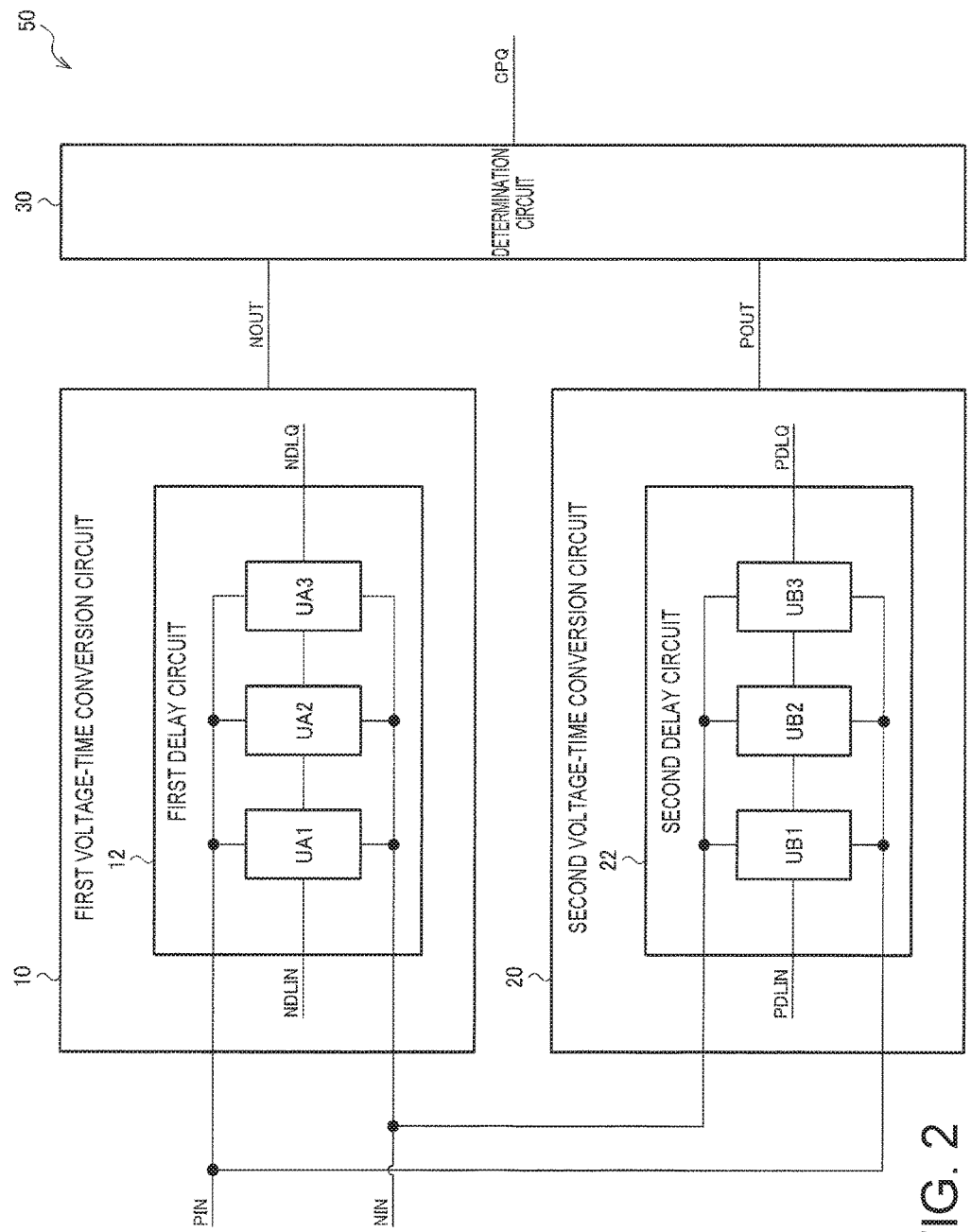
FIG. 2 shows a configuration example of a comparator of the embodiment.
Figure 3:
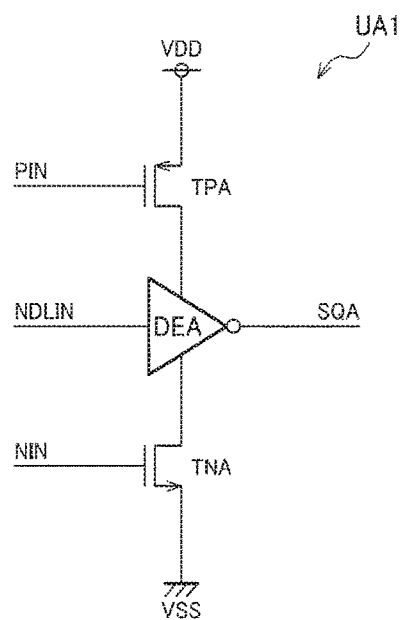
FIG. 3 shows a configuration example of a first delay unit.
Figure 4:
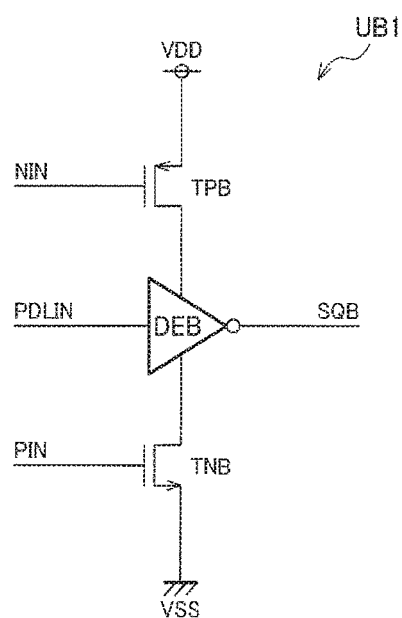
FIG. 4 shows a configuration example of a second delay unit.

FIG. 2 shows a configuration example of a comparator 50 of the embodiment. FIG. 3 shows the configuration example of a delay unit UA1, and FIG. 4 shows the configuration example of a delay unit UB1. The comparator 50 includes a first voltage-time conversion circuit 10, a second voltage-time conversion circuit 20, and a determination circuit 30.

The first voltage-time conversion circuit 10 includes a first delay circuit 12, and a first input signal PIN and a second input signal NIN are input thereto. The second voltage-time conversion circuit 20 includes a second delay circuit 22, and the first input signal PIN and the second input signal NIN are input thereto. The determination circuit 30 determines the magnitude relation of the first input signal PIN and the second input signal NIN, based on the first output signal NOUT from the first voltage-time conversion circuit 10 and the second output signal POUT from the second voltage-time conversion circuit 20.

Then, a first delay circuit 12 includes a delay unit UA1 (a first delay unit). The delay unit UA1 includes a first primary conductivity type transistor TPA of which current is controlled based on the first input signal PIN, a first secondary conductivity type transistor TNA of which current is controlled based on the second input signal NIN, and a first delay buffer DEA which is provided between the first primary conductivity type transistor TPA and the first secondary conductivity type transistor TNA and delays and outputs the input signal NDLIN of the delay unit UA1.

A second delay circuit 22 includes a delay unit UB1 (a second delay unit). The delay unit UB1 includes a second primary conductivity type transistor TPB of which current is controlled based on the second input signal NIN, a second secondary conductivity type transistor TNB of which current is controlled based on the first input signal PIN, and a second delay buffer DEB which is provided between the second primary conductivity type transistor TPB and the second secondary conductivity type transistor TNB and delays and outputs the input signal PDLIN of the delay unit UB1.

FIG. 2 shows a case where the delay circuits 12 and 22 respectively include a plurality of delay units UA1 to UA3, and UB1 to UB3, but without being limited thereto, the delay circuits 12 and 22 each may include one or a plurality of delay units. Further, the number of the plurality of delay units is arbitrary regardless of odd number or even number. FIGS. 3 and 4 respectively shows the delay units UA1 and UB1, the delay units UA2 and UA3 can be configured in the same manner as the delay unit UA1, and the delay units UB2 and UB3 can be configured in the same manner as the delay unit UB1.

Here, the first input signal PIN and the second input signal NIN are the voltages (an input voltage, a comparison voltage) to be compared by the comparator 50.

Further, the input signal NDLIN of the first delay circuit 12 and the input signal PDLIN of the second delay circuit 22 are signals having at least one edge (a change of a logical level). The signals NDLIN and PDLIN may be supplied from the outside of the voltage-time conversion circuits 10 and 20 or may be generated inside the voltage-time conversion circuits 10 and 20. For example, digital signals such as clock signals may be input as the signals NDLIN and PDLIN from the outside of the voltage-time conversion circuits 10 and 20. Alternatively, the output signals NDLQ and PDLQ of the delay circuits 12 and 22 may be processed by the logic circuits inside the voltage-time conversion circuits 10 and 20, and fed back as the signals NDLIN and PDLIN.

In addition, the first output signal NOUT is a signal based on the output signal NDLQ of the first delay circuit 12, and the second output signal POUT is a signal based on the output signal PDLQ of the second delay circuit 22. For example, the signals NDLQ and PDLQ may be directly output as the signals NOUT and POUT. Alternatively, the signals NDLQ and PDLQ may be input to a logic circuit such as a latch circuit or a counter, and the signals processed by the logic circuit may be output as the signals NOUT and POUT.

Further, the control of the current based on the input signals PIN and NIN means that signals based on the input signals PIN and NIN are input to the gate of the transistor, and a current (a drain current) flowing through the transistor is controlled depending on the voltage level of the signals input to the gate. That is, the transistors TPA and TPB control the current flowing from the power supply VDD (a high potential side power supply) to the high potential side power supply node of the delay buffers DEA and DEB based on the input signals PIN and NIN. The transistors TNA and TNB control the current flowing from the low potential side power supply node of the delay buffers DEA and DEB to the power supply VSS (a low potential side power supply, for example, ground) based on the input signals PIN and NIN. Note that the input signals PIN and NIN may be directly input to the gate of the transistor, or the input signals PIN and NIN may be input to a circuit such as a buffer and the output signal of the circuit may be input to the gate of the transistor.

In addition, the primary conductivity type is one of the positive and negative conductivity types, and the secondary conductivity type is the other of the positive and negative conductivity types. For example, the primary conductivity type transistor is a P type MOS transistor and the secondary conductivity type transistor is an N type MOS transistor.

In addition, the delay buffers DEA and DEB are circuits (for example, logic elements, logic circuits) that outputs the input logic level as forward or reverse. For example, the delay buffers DEA and DEB are inverters (logic inversion elements).

According to the embodiment, a transistor is inserted in both the power supply VDD side and the power supply VSS side of the delay buffers DEA and DEB. The input signals PIN and NIN of the comparator 50 are input to the gates of the transistors, and the current (the on-resistance of the transistor) flowing through the transistor is controlled based on the input signals PIN and NIN. This allows the delay buffers DEA and DEB to delay both the rising and falling edges.

Figure 5:
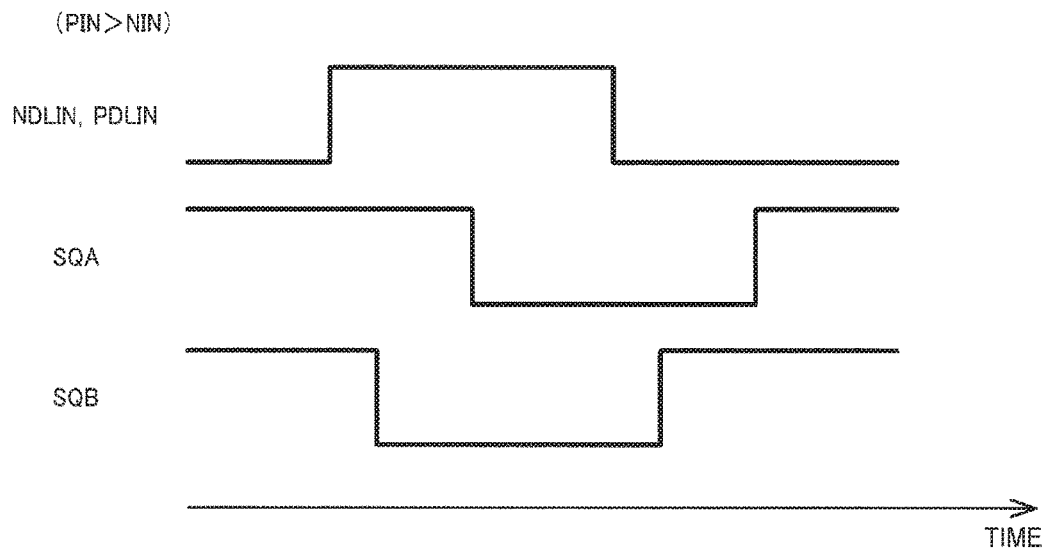
FIG. 5 is a timing chart illustrating the operations of the first delay unit and the second delay unit.

FIG. 5 is a timing chart illustrating delay by the delay units UA1 and UB1. The signals SQA and SQB are the output signals of the delay buffers DEA and DEB. The input signal of the delay unit is not limited to FIG. 5. For example, the rising edge may be input after the falling edge, or a signal like a clock signal in which rectangular waves repeat may be input.

As shown in FIG. 5, in a case of PIN>NIN, the current flowing through the transistors TPA and TNA in the delay unit UA1 in FIG. 3 is smaller than the current flowing through the transistors TPB and TNB in the delay unit UB1 in FIG. 4. Therefore, the delay time in the delay buffer DEA is larger at both edges than the delay time in the delay buffer DEB. On the other hand, although not shown in the drawing, in a case of PIN<NIN, the delay time in the delay buffer DEB is larger at both edges than the delay time at the delay buffer DEA. Here, the delay time is the time from the edges of the input signals NDLIN and PDLIN to the edges of the output signals SQA and SQB.

Figure 6:
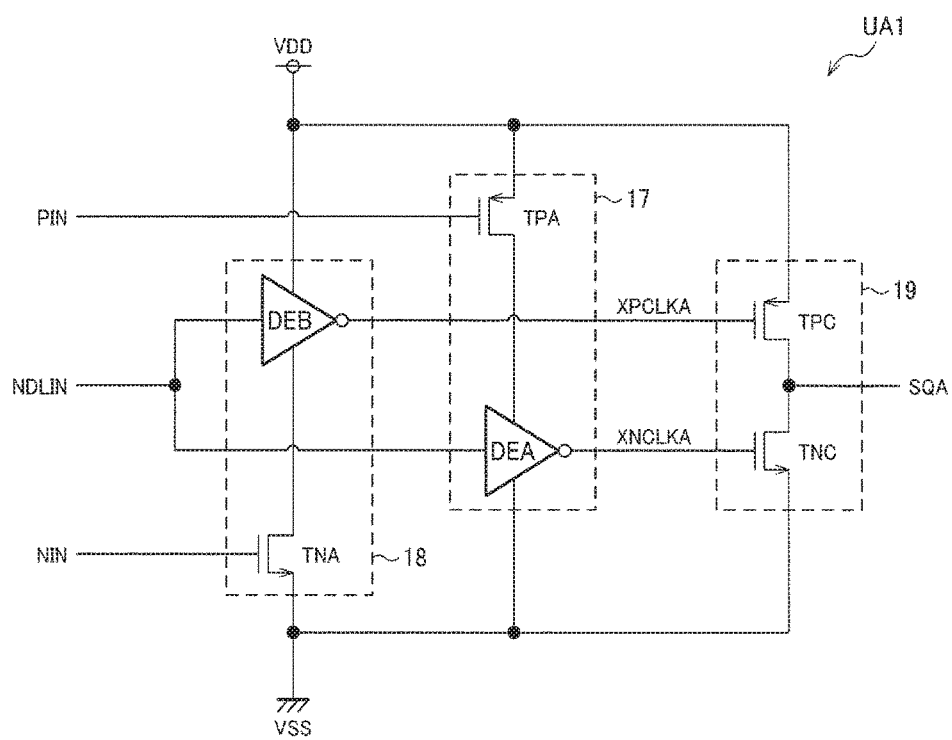
FIG. 6 shows another configuration example of the first delay unit.
Figure 7:
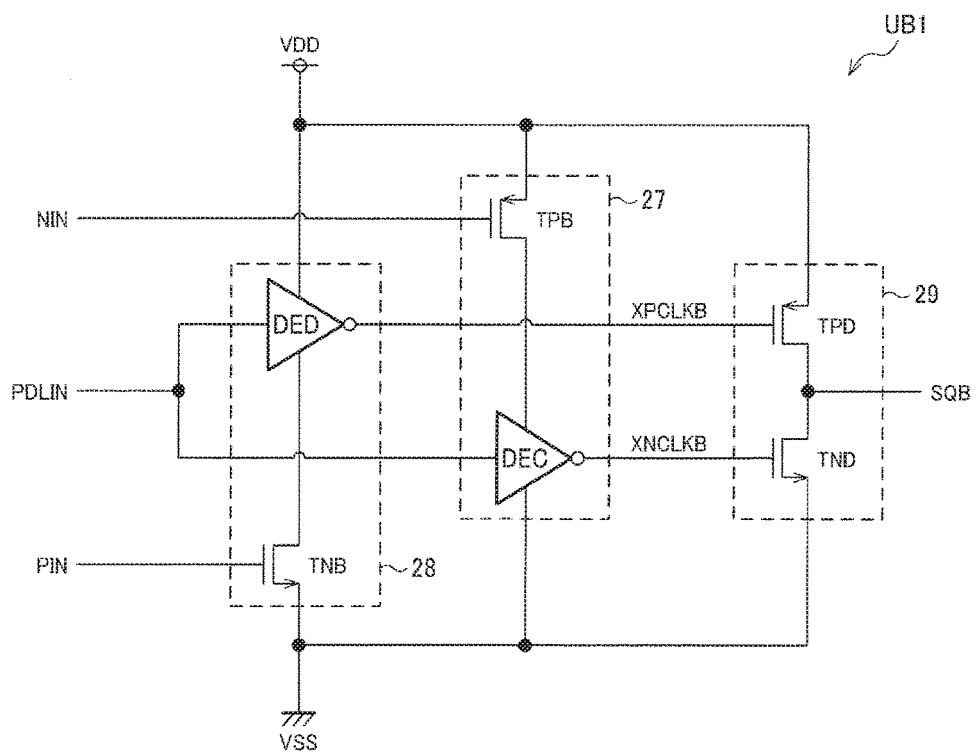
FIG. 7 shows another configuration example of the second delay unit.

FIG. 6 shows another configuration example of the delay unit UA1, and FIG. 7 shows another configuration example of the delay unit UB1.

The first delay circuit 12 shown in FIG. 6 includes a delay unit UA1 (first delay unit). The delay unit UA1 includes a first falling edge delay circuit 17, a first rising edge delay circuit 18, and a first output circuit 19. The first falling edge delay circuit 17 delays the falling edge of an input signal NDLIN of the delay unit UA1, based on the first input signal PIN. The first rising edge delay circuit 18 delays the rising edge of the input signal NDLIN of the delay unit UA1, based on the second input signal NIN. The first output circuit 19 generates a first delayed output signal SQA, based on the output signal XNCLKA of the first falling edge delay circuit 17 and the output signal XPCLKA of the first rising edge delay circuit 18.

The second delay circuit 22 shown in FIG. 7 includes a delay unit UB1 (second delay unit). The delay unit UB1 includes a second falling edge delay circuit 27, a second rising edge delay circuit 28, and a second output circuit 29. The second falling edge delay circuit 27 delays the falling edge of the input signal PDLIN of the delay unit UB1, based on the second input signal NIN. The second rising edge delay circuit 28 delays the rising edge of the input signal PDLIN of the delay unit UB1 based on the first input signal PIN. The second output circuit 29 generates a second delayed output signal SQB, based on the output signal XNCLKB of the second falling edge delay circuit 27 and the output signal XPCLKB of the second rising edge delay circuit 28.

FIG. 2 shows a case where the delay circuits 12 and 22 respectively include a plurality of delay units UA1 to UA3, and UB1 to UB3, but without being limited thereto, the delay circuits 12 and 22 each may include one or a plurality of delay units. The number of a plurality of delay units is not limited to 3, and is arbitrary. FIGS. 2, 3, 6, and 7 respectively shows the delay units UA1 and UB1, the delay units UA2 and UA3 can be configured in the same manner as the delay unit UA1, and the delay units UB2 and UB3 can be configured in the same manner as the delay unit UB1.

Here, the first input signal PIN and the second input signal NIN are the voltages (an input voltage, a comparison voltage) to be compared by the comparator 50.

Further, the input signal NDLIN of the first delay circuit 12 and the input signal PDLIN of the second delay circuit 22 are signals having at least one edge (a change of a logical level). The signals NDLIN and PDLIN may be supplied from the outside of the voltage-time conversion circuits 10 and 20 or may be generated inside the voltage-time conversion circuits 10 and 20. For example, digital signals such as clock signals may be input as the signals NDLIN and PDLIN from the outside of the voltage-time conversion circuits 10 and 20. Alternatively, the output signals NDLQ and PDLQ of the delay circuits 12 and 22 may be processed by the logic circuits inside the voltage-time conversion circuits 10 and 20, and fed back as the signals NDLIN and PDLIN.

In addition, the first output signal NOUT is a signal based on the output signal NDLQ of the first delay circuit 12, and the second output signal POUT is a signal based on the output signal PDLQ of the second delay circuit 22. For example, the signals NDLQ and PDLQ may be directly output as the signals NOUT and POUT. Alternatively, the signals NDLQ and PDLQ may be input to a logic circuit such as a latch circuit or a counter, and the signals processed by the logic circuit may be output as the signals NOUT and POUT.

According to the embodiment, the delay units UA1 and UB1 respectively include the falling edge delay circuits 17 and 27, and the rising edge delay circuits 18 and 28. This allows the delay circuits 12 and 22 to delay both the rising edge and the falling edge. This will be described later in detail in FIG. 8.

According to the embodiment, the falling edge delay circuits 17 and 27 and the rising edge delay circuits 18 and 28 are separately configured, and the output circuits 19 and 29 output the output signals SQA and SQB based on the output signals. Since the edge not delayed (for example, the rising edge in the falling edge delay circuits 17 and 27) steeply changes, a through current in the output circuits 19 and 29 can be reduced. Further, since the edge which is not delayed steeply changes, the change of the voltage level at the delayed edge is necessarily started from the power supply level, so that the delay time can be accurately generated.

In the embodiment, the first falling edge delay circuit 17 includes a first delay buffer DEA to which the input signal NDLIN of the delay unit UA1 is input, and a first primary conductivity type transistor TPA which is provided between a node of the first power-supply voltage (a node of the high potential side power supply VDD) and the first delay buffer DEA and of which current is controlled based on the first input signal PIN. The first rising edge delay circuit 18 includes a second delay buffer DEB to which the input signal NDLIN of the delay unit UA1 is input, and a first secondary conductivity type transistor TNA which is provided between a node of the second power-supply voltage (a node of the low potential side power supply VSS, for example, a node of ground) and the second delay buffer DEB and of which current is controlled based on the second input signal NIN. The second falling edge delay circuit 27 includes a third delay buffer DEC to which the input signal PDLIN of the delay unit UB1 is input, and a second primary conductivity type transistor TPB which is provided between a node of the first power-supply voltage and the third delay buffer DEC and of which current is controlled based on the second input signal NIN. The second rising edge delay circuit 28 includes a fourth delay buffer DED to which the input signal PDLIN of the delay unit UB1 is input, and a second secondary conductivity type transistor TNB which is provided between a node of the second power-supply voltage and the fourth delay buffer DED and of which current is controlled based on the first input signal PIN.

Here, the control of the current based on the input signals PIN and NIN means that signals based on the input signals PIN and NIN are input to the gate of the transistor, and a current (a drain current) flowing through the transistor is controlled depending on the voltage level of the signals input to the gate. That is, the transistors TPA and TPB control the current flowing from the power supply VDD to the high potential side power supply node of the delay buffers DEA and DEC based on the input signals PIN and NIN. The transistors TNA and TNB control the current flowing from the low potential side power supply node of the delay buffers DEB and DED to the power supply VSS based on the input signals PIN and NIN. Note that the input signals PIN and NIN may be directly input to the gate of the transistor, or the input signals PIN and NIN may be input to a circuit such as a buffer and the output signal of the circuit may be input to the gate of the transistor.

In addition, the primary conductivity type is one of the positive and negative conductivity types, and the secondary conductivity type is the other of the positive and negative conductivity types. For example, the primary conductivity type transistor is a P type MOS transistor and the secondary conductivity type transistor is an N type MOS transistor.

In addition, the delay buffers DEA, DEB, DEC and DED are circuits (for example, logic elements, logic circuits) that invert and output the input logic level. For example, the delay buffers DEA, DEB, DEC, and DED are inverters (logic inversion elements).

According to the embodiment, a transistor is inserted on the power supply VDD side of the delay buffers DEA and DEC. The input signals PIN and NIN of the comparator 50 are input to the gates of the transistors, and the current (the on-resistance of the transistor) flowing through the transistor is controlled based on the input signals PIN and NIN. This allows the delay buffers DEA and DEC to delay the falling edge (the rising edge in the output signal of the delay buffer). Further, a transistor is inserted on the power supply VSS side of the delay buffers DEB and DED. The input signals NIN and PIN of the comparator 50 are input to the gates of the transistors, and the current (the on-resistance of the transistor) flowing through the transistor is controlled based on the input signals NIN and PIN. This allows the delay buffers DEB and DED to delay the rising edge (the falling edge in the output signal of the delay buffer). In this way, the delay units UA1, UB1 will be able to delay both the rising edge and the falling edge.

In the embodiment, the first output circuit 19 includes a third secondary conductivity type transistor TNC which is provided between the output node of the delay unit UA1 and the node of the second power-supply voltage (the node of the power supply VSS), and of which the output signal XNCLKA of the first delay buffer DEA is input to a gate, and a third primary conductivity type transistor TPC which is provided between the node of the first power-supply voltage (the node of the power supply VDD) and the output node of the delay unit UA1, and of which the output signal XPCLKA of the second delay buffer DEB is input to a gate. The second output circuit 29 includes a fourth secondary conductivity type transistor TND which is provided between the output node of the delay unit UB1 and the node of the second power-supply voltage, and of which the output signal XNCLKB of the third delay buffer DEC is input to a gate, and a fourth primary conductivity type transistor TPD which is provided between the node of the first power-supply voltage and the output node of the delay unit UB1, and of which the output signal XPCLKB of the fourth delay buffer DED is input to a gate.

According to the embodiment, in a case where the input signals NDLIN and PDLIN of the delay units UA1 and UB1 fall, the output signals XNCLKA and XNCLKB of the delay buffers DEA and DEC rise, the transistors TNC and TND are turned on, and the delayed output signals SQA and SQB fall. In a case where the input signals NDLIN and PDLIN of the delay units UA1 and UB1 rise, the output signals XPCLKA and XPCLKB of the delay buffers DEB and DED rise, the transistors TPC and TPD are turned on, and the delayed output signals SQA and SQB rise. In this way, the output circuits 19 and 29 generate the delayed output signals SQA and SQB, based on the output signals XNCLKA and XNCLKB of the falling edge delay circuits 17 and 27 and the output signals XPCLKA and XPCLKB of the rising edge delay circuits 18 and 28.

Figure 8:
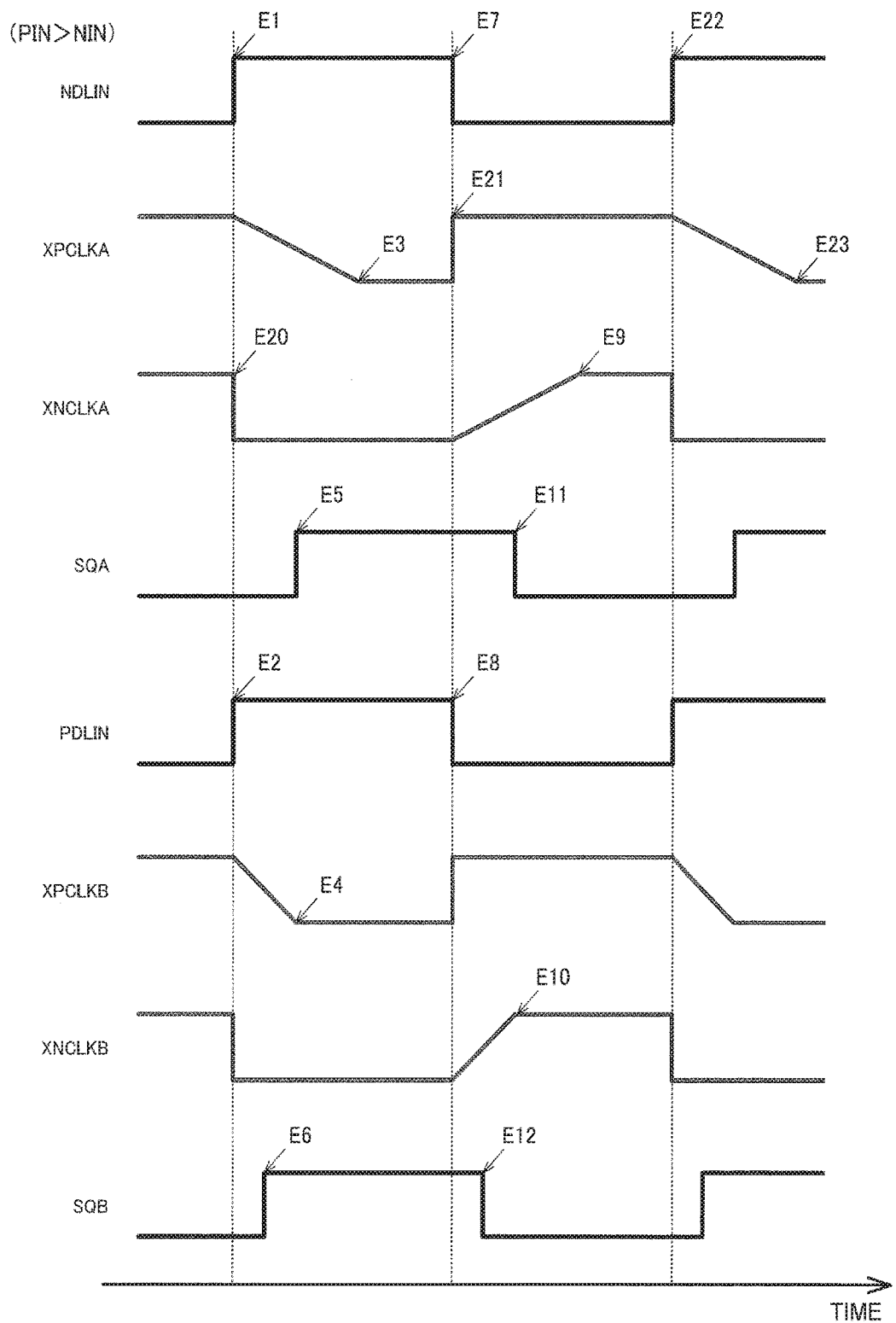
FIG. 8 is another timing chart illustrating the operations of the first delay unit and the second delay unit.

FIG. 8 is a timing chart illustrating operations of the delay units UA1 and UB1. Here, the case of PIN>NIN will be described as an example. The input signal of the delay unit is not limited to FIG. 8. For example, the rising edge may be input after the falling edge, or a signal like a clock signal in which rectangular waves repeat may be input.

As indicated by E1 and E2 in FIG. 8, in a case where the input signals NDLIN and PDLIN of the delay units UA1 and UB1 go to the high level from the low level, as indicated by E3 and E4, the output signals XPCLKA and XPCLKB of the delay buffers DEB and DED go to the low level from the high level. At this time, since PIN>NIN, the current flowing through the transistor TNA in the delay unit UA1 in FIG. 6 becomes smaller than the current flowing through the transistor TNB in the delay unit UB1 in FIG. 7. Therefore, the time when the output signal XPCLKA of the delay buffer DEB changes from a high level to a low level becomes longer than the time when the output signal XPCLKB of the delay buffer DED changes from a high level to a low level. As a result, as indicated by E5 and E6, the timing at which the transistor TPC is turned on and the delayed output signal SQA goes to the high level from the low level becomes later than the timing at which the transistor TPD is turned on and the delayed output signal SQB goes to the high level from the low level.

Similarly, as indicated by E7 and E8, in a case where the input signals NDLIN and PDLIN of the delay units UA1 and UB1 go to the low level from the high level, as indicated by E9 and E10, the output signals XNCLKA and XNCLKB of the delay buffers DEA and DEC go to the high level from the low level. At this time, since PIN>NIN, the current flowing through transistor TPA in delay unit UA1 in FIG. 6 becomes smaller than the current flowing in transistor TPB in the delay unit UB1 in FIG. 7. Therefore, the time when the output signal XNCLKA of the delay buffer DEA changes from the low level to the high level is longer than the time when the output signal XNCLKB of the delay buffer DEC changes from the low level to the high level. Thus, as shown by E11 and E12, the timing at which the transistors TNC is turned on and the delayed output signal SQA goes to the low level from the high level becomes later than the timing at which the transistor TND is turned on and the delayed output signal SQB goes to the low level from the high level.

In a case of PIN<NIN, the timing at which the delayed output signal SQA goes to the high level from the low level becomes earlier than the timing at which the delayed output signal SQB goes to the high level from the low level. The timing at which the delayed output signal SQA goes to the low level from the high level becomes earlier than the timing at which the delayed output signal SQB goes to the low level from the high level.

Figure 9:
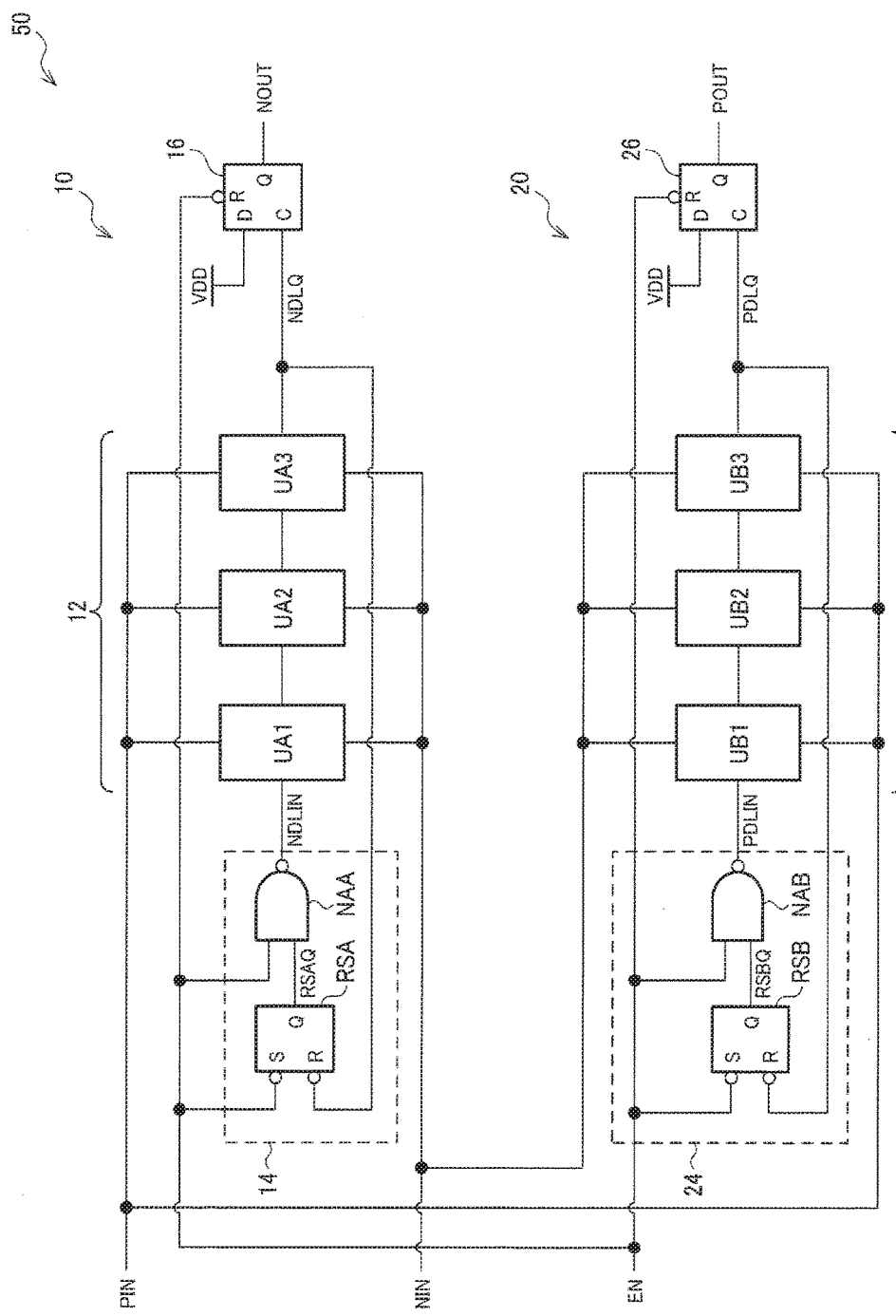
FIG. 9 shows a first detailed configuration example of the comparator of the embodiment.
Figure 10:
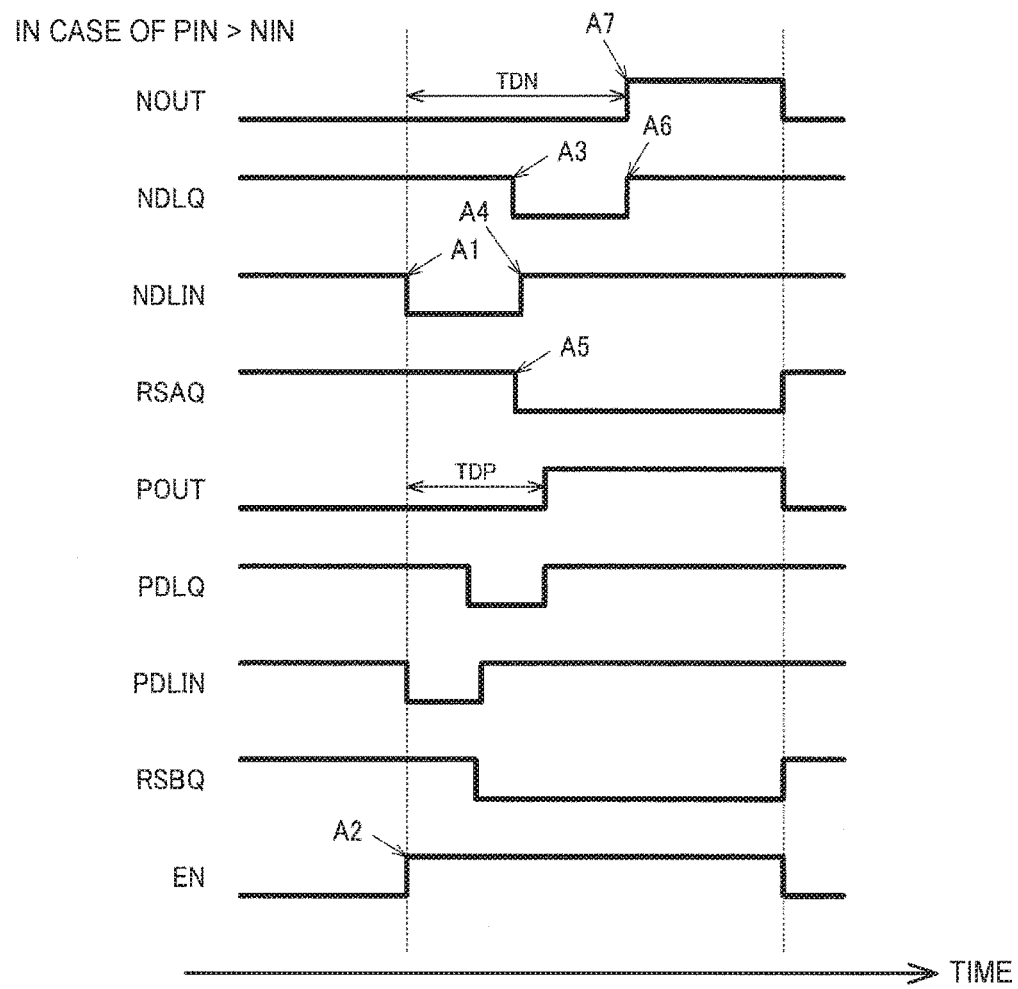
FIG. 10 is a timing chart illustrating the operation of the comparator of the first detailed configuration example, in a case of PIN>NIN.
Figure 11:
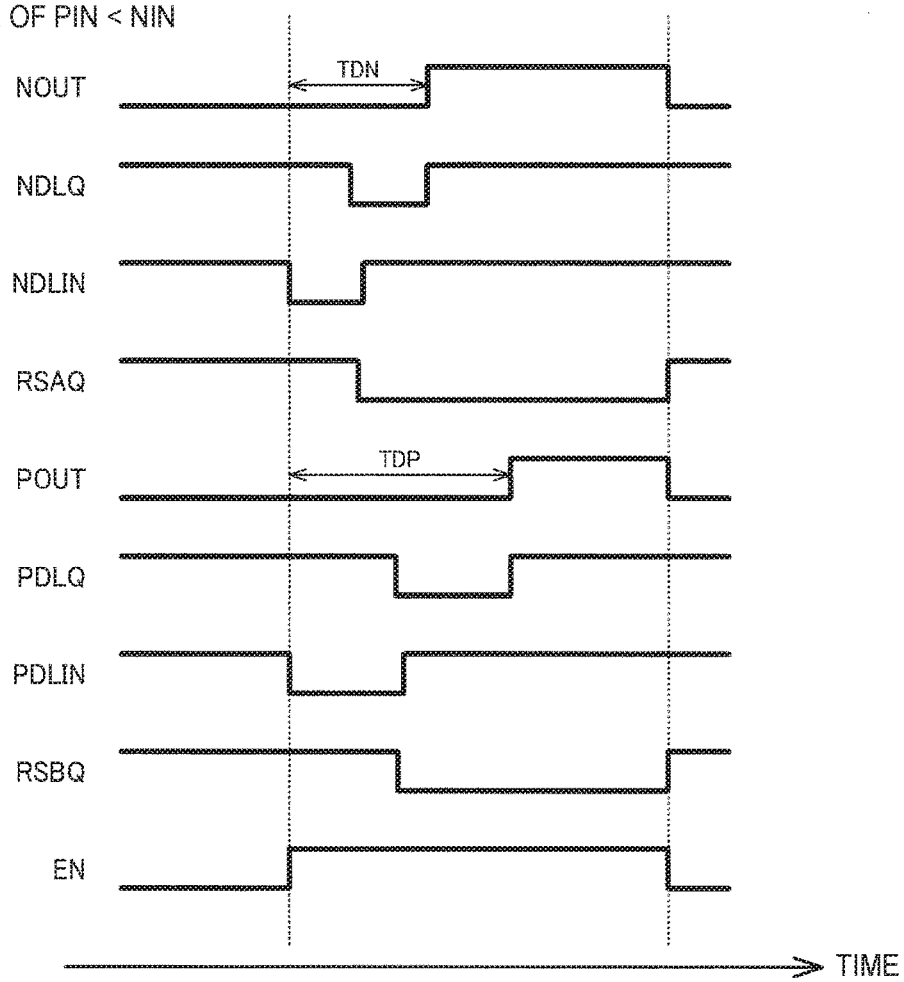
FIG. 11 is a timing chart illustrating the operation of the comparator of the first detailed configuration example, in a case of PIN<NIN.
Figure 15:
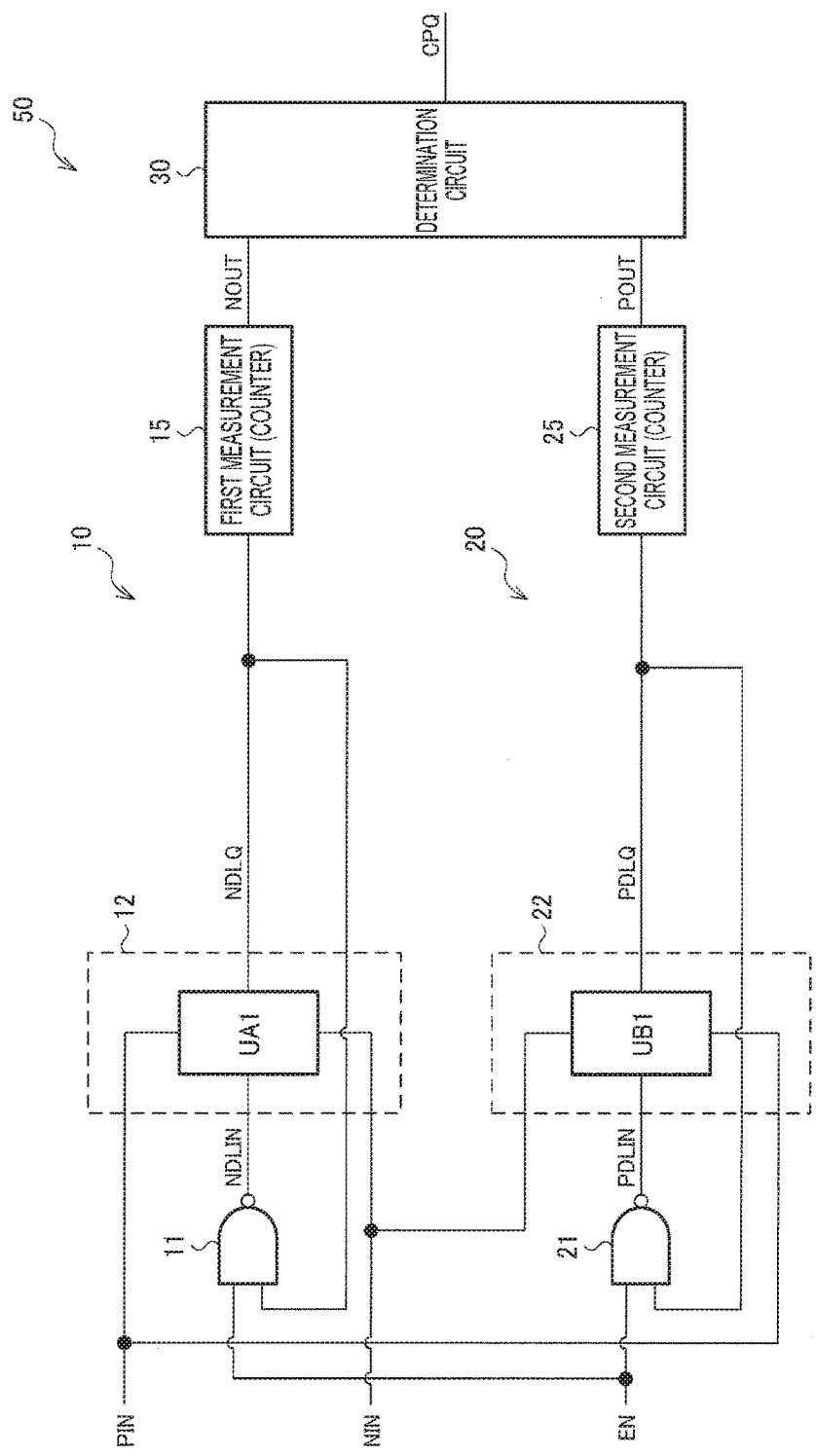
FIG. 15 shows a second detailed configuration example of the comparator of the embodiment.
Figure 16:
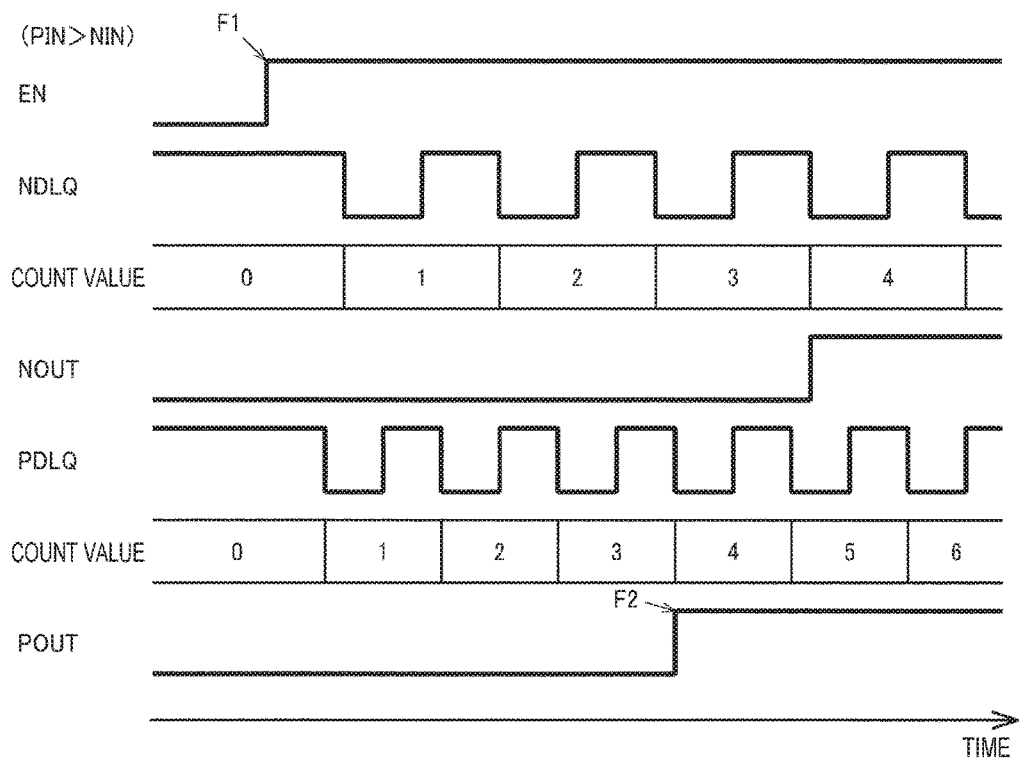
FIG. 16 is a timing chart illustrating the operation of the second detailed configuration example of the comparator.

As described above, in the embodiment, since the delay units UA1 and UB1 can delay both edges, it is possible to reduce the number of stages of the delay unit and to reduce the layout area of the comparator 50. For example, as illustrated in FIG. 9 to FIG. 11 below, since the input signal generation circuits 14 and 24 are provided and an edge makes two rounds of the delay circuits 12 and 22, the delay time can approximately be doubled. At this time, the falling edge and the rising edge in this order are propagated through the delay circuits 12 and 22 and delayed, but this is realized by delaying both edges. As illustrated in FIG. 15 and FIG. 16 below, the delay circuits 12 and 22 may be incorporated in the ring oscillator. In this case, the oscillation signal (clock signal) of the ring oscillator propagates through the delay circuits 12 and 22, and the oscillation frequency differs according to the delay. This is also realized by delaying both edges. In this way, since both edges can be delayed, it is possible to generate delays a plurality of times by the delay circuits 12 and 22, thereby increasing the delay time while reducing the number of stages.

In the embodiment, in the first delay buffer DEA, a delay time is controlled based on a current flowing through the first primary conductivity type transistor TPA. In the second delay buffer DEB, a delay time is controlled based on a current flowing through the first secondary conductivity type transistor TNA. In the third delay buffer DEC, a delay time is controlled based on a current flowing through the second primary conductivity type transistor TPB. In the fourth delay buffer DED, a delay time is controlled based on a current flowing through the second secondary conductivity type transistor TNB.

That is, in a case where the inputs of the delay buffers DEA and DEC fall from the high level to the low level, the output rises from the low level to the high level due to the current flowing through the primary conductivity type transistors TPA and TPB. In this case, the delay time of the rising edge of the output is determined by the current flowing through the primary conductivity type transistors TPA and TPB according to the signals PIN and NIN. On the other hand, in a case where the inputs of the delay buffers DEB and DED rise from the low level to the high level, the output falls from the high level to the low level due to the current flowing through the secondary conductivity type transistors TNA and TNB. In this case, the delay time of the falling edge of the output is determined by the current flowing through the secondary conductivity type transistors TNA and TNB according to the signals NIN and PIN. Note that the delay time may be controlled by directly supplying the current flowing through the transistor to the power supply node of the delay buffer, or the delay time may be controlled by supplying the current flowing through the transistor to the power supply node of the delay buffer through some circuits or elements.

In this way, at each edge, the delay time is controlled based on the current flowing through the primary conductivity type transistor or the secondary conductivity type transistor. By providing both the delay buffer provided with the primary conductivity type transistor and the delay buffer provided with the secondary conductivity type transistor, it is possible to control the delay time at both edges.

As described above, the first voltage-time conversion circuit 10 outputs the first time information signal NOUT corresponding to the first delay time that is increased as the voltage of the first input signal PIN is larger than the voltage of the second input signal NIN.

The second voltage-time conversion circuit 20 outputs the second time information signal POUT corresponding to the second delay time that becomes longer as the voltage of the second input signal NIN becomes larger than the voltage of the first input signal PIN.

Thus, it is possible to convert the input signal into a time information signal indicating the time of the length according to the magnitude of the voltage of the input signal.

3. First Detailed Configuration

FIG. 9 shows a first detailed configuration example of the comparator 50 in the embodiment. In FIG. 9, the first voltage-time conversion circuit 10 includes a first delay circuit 12, a first input signal generation circuit 14, and a first latch circuit 16, and the second voltage-time conversion circuit 20 includes a second delay circuit 22, a second input signal generation circuit 24, and a second latch circuit 26.

A delay circuit of each of the first delay circuit 12 and the second delay circuit 22 includes a plurality of delay units connected in series. Each delay unit is the delay unit shown in FIGS. 6 and 7. Here, being connected in series means that the output signal of the delay unit becomes the input signal of the next delay unit. In FIG. 9, the case where the delay circuits 12 and 22 each has three delay units is shown, but it is not limited to this.

In this way, each delay circuit includes a plurality of delay units, such that the gain for converting the voltage to time can be increased. In the embodiment, since the edges are delayed twice by the delay circuits 12 and 22, it is possible to realize the same gain as in the case of delaying the edge only once, with about half the number of delay units.

The first input signal generation circuit 14 generates an input signal NDLIN of the first delay circuit 12, and outputs the input signal NDLIN to the first delay circuit 12. The first latch circuit 16 is a latch circuit operating based on the output signal NDLQ of the first delay circuit 12. The second input signal generation circuit 24 generates an input signal PDLIN of the second delay circuit 22, and outputs the input signal PDLIN to the second delay circuit 22. The second latch circuit 26 is a latch circuit operating based on the output signal PDLQ of the second delay circuit 22.

Specifically, the first input signal generation circuit 14 includes an RS latch RSA in which an enable signal EN is input to a set terminal and an output signal NDLQ of the delay circuit 12 is input to a reset terminal, and a NAND circuit (negative AND circuit) NAA in which the enable signal EN and the output signal RSAQ of the RS latch RSA are input. The output signal of the NAND circuit NAA is the input signal NDLIN of the delay circuit 12. The second input signal generation circuit 24 includes an RS latch RSB in which the enable signal EN is input to a set terminal and an output signal PDLQ of the delay circuit 22 is input to a reset terminal, and a NAND circuit NAB in which the enable signal EN and the output signal RSBQ of the RS latch RSB are input. The output signal of the NAND circuit NAB is the input signal PDLIN of the delay circuit 22. The enable signal EN is input from, for example, the control circuit and the processing circuit included in the circuit device including the comparator. Alternatively, the enable signal EN may be input from a CPU or the like provided outside the circuit device including the comparator.

The latch circuits 16 and 26 are, for example, flip-flop circuits. The enable signal EN is input to the reset terminal (low active) of the latch circuit 16, the first logic level (for example, the high level) is input to the data terminal, and the output signal NDLQ of the delay circuit 12 is input to the clock terminal. The output signal of the latch circuit 16 is the output signal NOUT of the voltage-time conversion circuit 10. The enable signal EN is input to the reset terminal (low active) of the latch circuit 26, the first logic level (for example, the high level) is input to the data terminal, and the output signal PDLQ of the delay circuit 22 is input to the clock terminal. The output signal of the latch circuit 26 is the output signal POUT of the voltage-time conversion circuit 20. Note that the latch circuits 16 and 26 are not limited to the flip-flop circuits, and any circuit may be used as long as the circuit fetch the input signal and output the fetched signal.

With such a configuration, the first edges propagating through the delay circuits 12 and 22 are fed back to the inputs of the delay circuits 12 and 22 as the second edges by the input signal generation circuits 14 and 24. Then, the edges obtained by two rounds by the delay circuits 12 and 22 are latched by the latch circuits 16 and 26. In this way, since the edge makes two rounds of the delay circuits 12 and 22, the number of stages of the delay units can approximately be halved while maintaining the delay time.

FIG. 10 is a timing chart illustrating the operation of the comparator 50 of FIG. 9, in a case of PIN>NIN.

As indicated by A1 of FIG. 10, the first input signal generation circuit 14 changes the input signal NDLIN of the first delay circuit 12 from a high level (a first logic level) to a low level (a second logic level). That is, as indicated by A2, the enable signal EN changes from the low level to the high level, whereby the output signal (input signal NDLIN) of the NAND circuit NAA changes from the high level to the low level.

As indicated by A3, the falling edge of the input signal NDLIN propagates through the delay circuit 12, and the output signal NDLQ of the delay circuit 12 changes from the high level to the low level. In this case, as indicated by A4, the input signal generation circuit 14 changes the input signal NDLIN of the delay circuit 12 from the low level to the high level. That is, as indicated by A5, the RS latch RSA is reset by the output signal NDLQ becoming the low level, and the output signal RSAQ of the RS latch RSA changes from the high level to the low level. As the output signal RSAQ of the RS latch RSA goes to the low level, the output signal (the input signal NDLIN) of the NAND circuit NAA changes from the low level to the high level.

As indicated by A6, the rising edge of the input signal NDLIN propagates through the delay circuit 12, and the output signal NDLQ of the delay circuit 12 changes from the low level to the high level. In this case, the first latch circuit 16 receives a signal of a high level. That is, when the enable signal EN is the high level, the latch circuit 16 is released from reset. When the input signal (the output signal NDLQ) of the clock terminal rises, the input signal (high level) of the data terminal is fetched and the output signal NOUT changes from the low level to the high level.

In this way, the edge makes two rounds of the delay circuit 12 after the enable signal EN goes to the high level, and the output signal NOUT goes to the high level after the delay time TDN.

The operation of the second voltage-time conversion circuit 20 is the same. That is, the second input signal generation circuit 24 changes the input signal PDLIN of the second delay circuit 22 from a high level to a low level. In a case where the output signal PDLQ of the delay circuit 22 changes from the high level to the low level, the input signal generation circuit 24 changes the input signal PDLIN of the delay circuit 22 from the low level to the high level. In a case where the output signal PDLQ of the delay circuit 22 is changed from the low level to the high level, the second latch circuit 26 receives a signal of a high level. In this way, the edge makes two rounds of the delay circuit 22 after the enable signal EN goes to the high level, and the output signal POUT goes to the high level after the delay time TDP.

In the case of PIN>NIN, it is established that TDP<TDN, the output signal POUT rises earlier than the output signal NOUT. In a case where it is detected that the output signal POUT rises earlier, the determination circuit 30 determines that PIN>NIN, and outputs the determination result (for example, a determination signal CPQ of a high level).

FIG. 11 is a timing chart illustrating the operation of the comparator 50 of FIG. 9, in a case of PIN<NIN. Since the operation is the same as in FIG. 10, the description thereof will be omitted.

In the case of PIN<NIN, it is established that TDP>TDN, the output signal NOUT rises earlier than the output signal POUT. In a case where it is detected that the output signal NOUT rises earlier, the determination circuit 30 determines that PIN<NIN, and outputs the determination result (for example, a determination signal CPQ of a low level).

4. Determination Circuit and Flag Signal Generation Circuit

FIG. 12 is a detailed configuration example of the determination circuit 30 and the flag signal generation circuit 60. In addition, the configurations of the determination circuit 30 and the flag signal generation circuit 60 are not limited to FIG. 12, but any circuit may be used as long as the circuit is able to determine whether the edge is output earlier than any one of the signals NOUT and POUT.

The determination circuit 30 and the flag signal generation circuit 60 of FIG. 12 include buffers BFE1 and BFE2 that delay the signals NOUT and POUT, an RS latch RSE1 to which the output signals of the buffers BFE1 and BFE2 are input, an AND circuit ANE (logical product circuit) that outputs a logical product of the signals NOUT and POUT, an OR circuit ORE (logical sum circuit) that outputs a logical sum of the output signals of the buffers BFE1 and BFE2, and an RS latch RSE2 to which the output signals of the AND circuit ANE and the OR circuit ORE are input.

The output signal of the RS latch RSE1 is the determination signal CPQ. In the case of PIN>NIN, the determination signal CPQ goes to a high level, and in the case of PIN<NIN, the determination signal CPQ goes to a low level.

The output signal LATCH of the OR circuit ORE goes to a high level (active) in a case where any of the signals NOUT and POUT goes to the high level (that is, in a case where the determination is confirmed).

The output signal of the RS latch RSE2 is a minute determination flag signal SFLAG indicating whether or not the voltage difference (time difference between the signals POUT and NOUT) between the signals PIN and NIN is minute. In a case where the voltage difference is minute, the signal SFLAG goes to the high level (active), and in a case where the voltage difference is not minute, the signal SFLAG goes to the low level. In a case where the voltage difference between the signals PIN and NIN is small, the comparator 50 has a dead zone of magnitude comparison (a range where a determination result is stochastically determined, as will be described later). For example, the voltage difference determined to be minute is set to the extent of the dead zone. In a case where the signal SFLAG is at a high level, magnitude comparison is made a plurality of times for the same signals PIN and NIN. This makes it possible to substantially reduce the dead zone.

Figure 13:
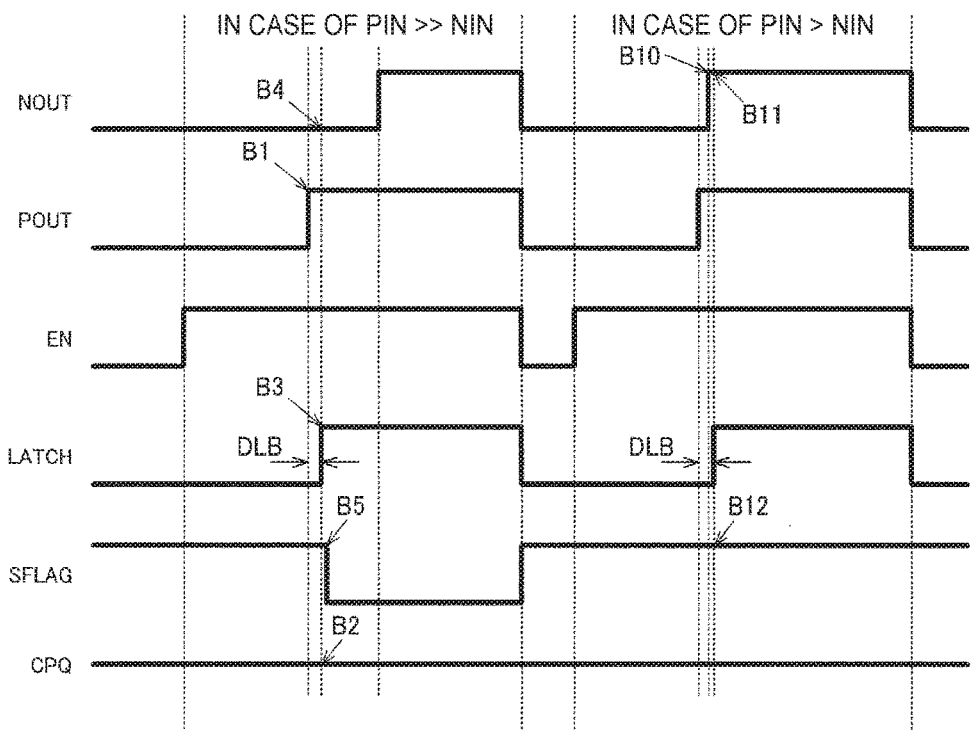
FIG. 13 is a timing chart illustrating the operations of the determination circuit and the flag signal generation circuit, in a case of PIN>NIN.

FIG. 13 is a timing chart illustrating the operations of the determination circuit 30 and the flag signal generation circuit 60, in a case of PIN>NIN. PIN>>NIN indicates that the signal PIN is a voltage sufficiently larger than the signal NIN (not a minute signal).

First, the size determination of the signals PIN and NIN will be described. As indicated by B1 in FIG. 13, the signal POUT goes to a high level from a low level earlier than the signal NOUT. Then, as indicated by B2, the RS latch RSE1 latches the high level after the delay time by the buffer BFE2, and the determination signal CPQ is determined to be the high level. This determination operation is the same regardless of whether or not it is a minute signal.

Next, the minute determination flag signal SFLAG will be described. First, a case where it is not a minute signal will be described. As indicated by B3, the signal LATCH goes to the high level from the low level after the delay time DLB by the buffer BFE2 since the signal POUT goes to the high level. In the case of PIN>>NIN, when the signal LATCH goes to the high level, the signal NOUT is at the low level as indicated by B4 (since the time difference is large, it does not go to the high level). Therefore, the output signal of the AND circuit ANE is at a low level, the RS latch RSE2 latches the low level as indicated by B5, and the signal SFLAG is determined to be the low level.

Next, a case of a minute signal will be described. As indicated by B10, the time difference between the falling edges of the signals POUT and NOUT is smaller than the delay time DLB by the buffer BFE2. In this case, when the signal LATCH goes to the high level, the signal NOUT is at the high level as indicated by B11. Therefore, the output signal of the AND circuit ANE is at a high level, the RS latch RSE2 latches the high level as indicated by B12, and the signal SFLAG is determined to be the high level.

Figure 14:
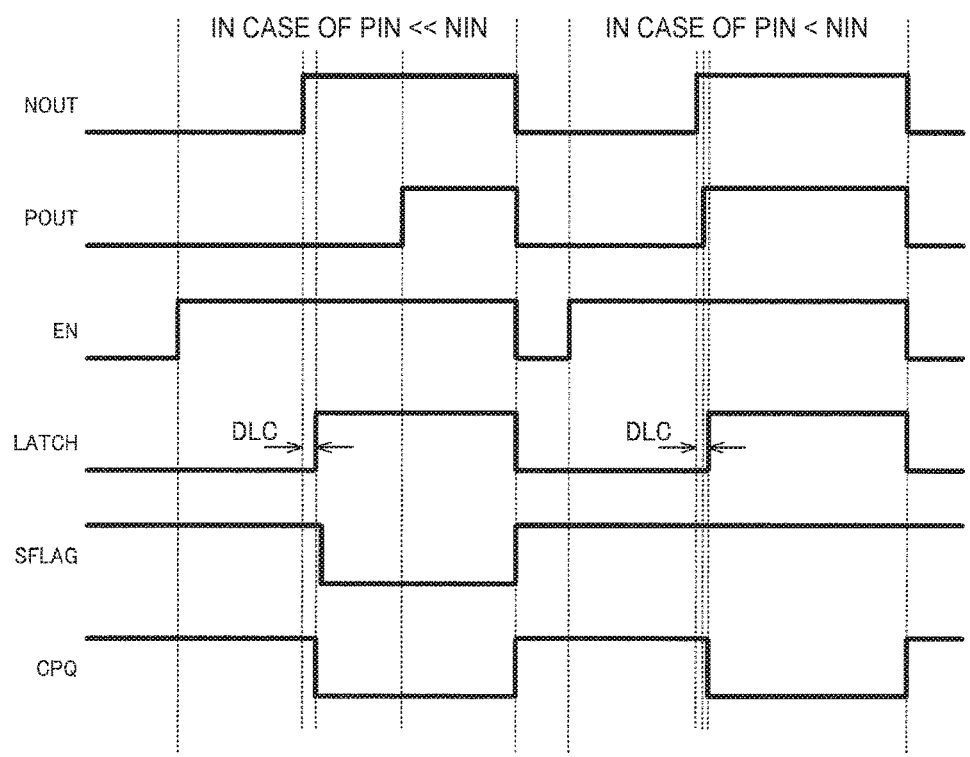
FIG. 14 is a timing chart illustrating the operations of the determination circuit and the flag signal generation circuit, in a case of PIN<NIN.

FIG. 14 is a timing chart illustrating the operations of the determination circuit 30 and the flag signal generation circuit 60, in a case of PIN<NIN. PIN<<NIN indicates that the signal NIN is a voltage sufficiently larger than the signal PIN (not a minute signal).

Since the operation is the same as in the case of PIN>NIN, the outline will be described. In the case of PIN<NIN, since the signal NOUT goes to a high level from a low level earlier than the signal POUT, the RS latch RSE1 latches the low level after the delay time by the buffer BFE1 and the determination signal CPQ is determined to be the low level.

In a case where it is not a minute signal, the signal LATCH goes to the high level from the low level after the delay time DLC by the buffer BFE1 since the signal NOUT goes to the high level, the RS latch RSE2 latches the low level, and the signal SFLAG is determined to be the low level. In the case of a minute signal, the time difference between the falling edges of the signals POUT and NOUT is smaller than the delay time DLC by the buffer BFE1. In this case, when the signal LATCH goes to the high level, the RS latch RSE2 latches the high level and the signal SFLAG is determined to be the high level.

In this manner, the flag signal generation circuit 60 generates the flag signal SFLAG (FS in FIG. 1), based on the first time information signal NOUT, the second time information signal POUT, a first delay signal obtained by delaying the first time information signal NOUT, and a second delay signal obtained by delaying the second time information signal POUT.

Thus, it is possible to compare the magnitudes of the first input signal and the second input signal on the time axis to generate the flag signal SFLAG.

Specifically, as described above with reference to FIG. 12, the flag signal generation circuit 60 generates the flag signal SFLAG, based on a first signal obtained by a logical product (ANE) of the first time information signal NOUT and the second time information signal POUT, and a second signal obtained by a logical sum (ORE) of the first delay signal and the second delay signal.

The first signal goes to a high level in a case where both the first time information signal NOUT and the second time information signal POUT are at the high level, and it goes to a low level in the other cases.

The second signal is a signal which goes to a high level in a case where at least one of the first delay signal and the second delay signal is at the high level, and goes to a low level in a case where both the first delay signal and the second delay signal are at the low level.

Thus, it is possible to determine whether or not the signal level of the first time information signal or the second time information signal changes after a given delay time elapses, to generate a flag signal, and the like.

Further, as shown in FIG. 12, the flag signal generation circuit 60 includes a latch circuit RSE2 that latches the first signal, based on the second signal.

Thus, the flag signal generation circuit 60 causes the flag signal SFLAG to be active, in a case where the first signal is at a low level and the second signal is at the high level.

Further, the control circuit 70 determines the end of the comparison operation of the comparator 50 based on the second signal. As described above, the comparison result can be determined in a case where any logical level of the first time information signal (NOUT) and the second time information signal (POUT) changes. The second signal is a signal of which logic level changes in a case where any logical level of the first time information signal (NOUT) and the second time information signal (POUT) changes. That is, it is possible to determine the end of the comparison operation of the comparator 50 based on the second signal.

Thus, the comparison time can be shortened. For example, in a case where the logical level of the first time information signal (NOUT) changes earlier, it is determined that the comparison operation is ended without waiting for the change of the logical level of the second time information signal (POUT), and it is possible to proceed to the next comparison operation based on the determination result.

5. Second Detailed Configuration

FIG. 15 shows a second detailed configuration example of the comparator 50 of the embodiment. In FIG. 15, the first voltage-time conversion circuit 10 includes a first delay circuit 12, a third input signal generation circuit 11, and a first measurement circuit 15, and the second voltage-time conversion circuit 20 includes a second delay circuit 22, a fourth input signal generation circuit 21, and a second measurement circuit 25.

The first measurement circuit 15 measures the number of pulses of the output signal NDLQ from the first delay circuit 12. The second measurement circuit 25 measures the number of pulses of the output signal PDLQ from the second delay circuit 22. The determination circuit 30 determines the magnitude relation of the first input signal PIN and the second input signal NIN, based on the measurement results from the first measurement circuit 15 and the second measurement circuit 25.

For example, the measurement circuits 15 and 25 are counters that count the number of pulses of the signals NDLQ and PDLQ, and set the signals NOUT and POUT to the high level in a case where the count value reaches a predetermined value. The measurement circuits 15 and 25 are not limited to counters, and may be any circuit as long as the circuit can convert the number of pulses of signals NDLQ and PDLQ into signals NOUT and POUT. For example, the measurement circuits may be shift registers in which bits are shifted by pulses of the signals NDLQ and PDLQ.

A delay circuit of each of the first delay circuit 12 and the second delay circuit 22 includes, for example, a delay unit of only one stage. Alternatively, each delay circuit may be a plurality of delay units connected in series.

According to the embodiment, the frequencies (the number of pulses per unit time) of the output signals NDLQ and PDLQ from the delay circuits 12 and 22 change with delay times according to the signals PIN and NIN. This makes it possible to determine the magnitude relation of the signals PIN and NIN based on the number of pulses of the signals NDLQ and PDLQ.

In the embodiment, the first voltage-time conversion circuit 10 includes a first ring oscillator in which the output signal NDLQ of the first delay circuit 12 is fed back to the input signal NDLIN. The second voltage-time conversion circuit 20 includes a second ring oscillator in which the output signal PDLQ of the second delay circuit 22 is fed back to the input signal PDLIN.

The first ring oscillator corresponds to a loop configured with the third input signal generation circuit 11 and the first delay circuit 12. The second ring oscillator corresponds to a loop configured with the fourth input signal generation circuit 21 and the second delay circuit 22.

In this way, by configuring the ring oscillator including the delay circuits 12 and 22, the oscillation frequency of the ring oscillator varies according to the signals PIN and NIN. This makes it possible to determine the magnitude relation of the signals PIN and NIN based on the number of pulses of the signals NDLQ and PDLQ.

In the embodiment, the third input signal generation circuit 11 receives the enable signal EN and the signal based on the output signal NDLQ of the first delay circuit 12, and generates the input signal NDLIN of the first delay circuit 12. The fourth input signal generation circuit 21 receives the enable signal EN and the signal based on the output signal PDLQ of the second delay circuit 22, and generates the input signal PDLIN of the second delay circuit 22.

For example, the input signal generation circuits 11 and 21 are NAND circuits (negative logical product circuit). In this case, if the enable signal EN goes to the high level, the NAND circuit functions in the same way as the inverter for the signals NDLQ and PDLQ. That is, ring oscillators (delay units UA1 and UA2 are not logically inverted) by odd-numbered inverted logic circuits are configured.

With such a configuration, it is possible to configure a first ring oscillator in which the output signal NDLQ of the first delay circuit 12 is fed back to the input signal NDLIN, and a second ring oscillator in which the output signal PDLQ of the second delay circuit 22 is fed back to the input signal PDLIN.

In FIG. 15, the signals based on the output signals NDLQ and PDLQ of the delay circuits 12 and 22 are the output signals NDLQ and PDLQ of the delay circuits 12 and 22. However, without being limited thereto, signals based on the signals NDLQ and PDLQ may be signals obtained by processing the signals NDLQ and PDLQ by some elements or circuits.

FIG. 16 is a timing chart illustrating the operation of the second detailed configuration example of the comparator 50. FIG. 16 illustrates the case where the predetermined value of the count value is "4", but the predetermined value is not limited to "4".

As indicated by F1 in FIG. 16, if the enable signal EN goes to the high level from the low level, the ring oscillator starts oscillating. In the case of PIN>NIN, since the delay time of the first delay circuit 12 is larger than that of the second delay circuit 22, and the oscillation frequency of the first ring oscillator is lower than that of the second ring oscillator (the number of pulses of the signal NDLQ per unit time decreases). Therefore, as indicated by F2, the count value of the second measurement circuit 25 reaches the predetermined value "4" earlier than the count value of the first measurement circuit 15, and the signal POUT goes to the high level from the low level earlier than the signal NOUT.

In a case of PIN<NIN, since the oscillation frequency of the second ring oscillator is lower than that of the first ring oscillator, the count value of the first measurement circuit 15 reaches a predetermined value earlier than the count value of the second measurement circuit 25, and the signal NOUT goes to the high level from the low level earlier than the signal POUT.

6. With Regard to Dead Zone of Comparator

FIG. 17 is a diagram illustrating a dead zone of the comparator. The voltage input to the positive terminal of comparator is set to VP, and the voltage input to the negative terminal is set to VN. In FIG. 17, the horizontal axis represents the voltage Vin=VP−VN, and the vertical axis represents the probability that the output of the comparator goes to a high level.

Here, the comparator is considered as a model. That is, a model is considered in which a voltage VP+Vn is input to the positive terminal of a comparator without a dead zone and a voltage VN is input to the negative terminal. The absence of a dead zone means that the output is determined to be the high level (100%) in a case of VP>VN, and the output is determined to be the low level (100%) in a case of VP<VN. The voltage Vn is a noise according to a normal distribution in which the average value is zero and the variance is the square of σ. In this case, the probability f(Vin) that the output of the comparator goes to a high level is a cumulative distribution function like the following Expression (1). Here, erf( ) is an error function.

$$f(Vin) = \frac{1}{2}\left(1 + \mathrm{erf}\left(\frac{Vin}{\sqrt{2\sigma^2}}\right)\right) \quad (1)$$

Since the right side of Expression (1) is a function of Vin/σ, the same probability f(Vin) is obtained if Vin/σ is the same.

As illustrated in FIG. 17, for example, the voltage range of −σ≤Vin≤+σ (so-called 1 sigma) is defined as a dead zone. In this voltage range, the probability that the output of comparator goes to a high level is in the range of 15.9% or more and 84.1% or less.

In addition, in FIG. 12, the minute determination flag signal SFLAG is described. By setting the delay time of the buffers BFE1 and BFE2 such that the signal SFLAG becomes active in a case where the voltage Vin is within the range of the dead zone, it becomes possible to know that the input voltage is within the range of the dead zone, and to take various countermeasures accordingly.

7. Circuit Device

FIG. 18 is a configuration example of the circuit device 100 including the comparator 50 of the embodiment. Here, a configuration example of a sequential comparison type A/D conversion circuit is illustrated as an example of the circuit device 100. In addition, the circuit device 100 is not limited to this configuration, and may include the comparator 50.

The circuit device 100 includes a comparator 50, a control unit 120 (a control circuit), a sample and hold circuit 130 (an S/H circuit), and a D/A conversion circuit 140 (DAC).

The sample and hold circuit 130 samples and holds the input voltage VIN and outputs the held voltage SIN. The control unit 120 outputs the sequential comparison data RDA stored in the sequential comparison register 121 to the D/A conversion circuit 140. The D/A conversion circuit 140 performs D/A conversion of the sequential comparison data RDA, and outputs the converted voltage DQ. The comparator 50 compares the magnitude of the voltage SIN with the magnitude of the voltage DQ, and outputs the determination signal CPQ. That is, in FIG. 18, the voltages SIN and DQ correspond to the signals PIN and NIN in FIG. 1 or the like. The control unit 120 updates the sequential comparison data RDA stored in the sequential comparison register 121 based on the determination signal CPQ. The control unit 120 repeatedly updates such sequential comparison data RDA, and outputs finally obtained sequential comparison data RDA as A/D conversion data DOUT.

8. Physical Quantity Sensor

Figure 19:
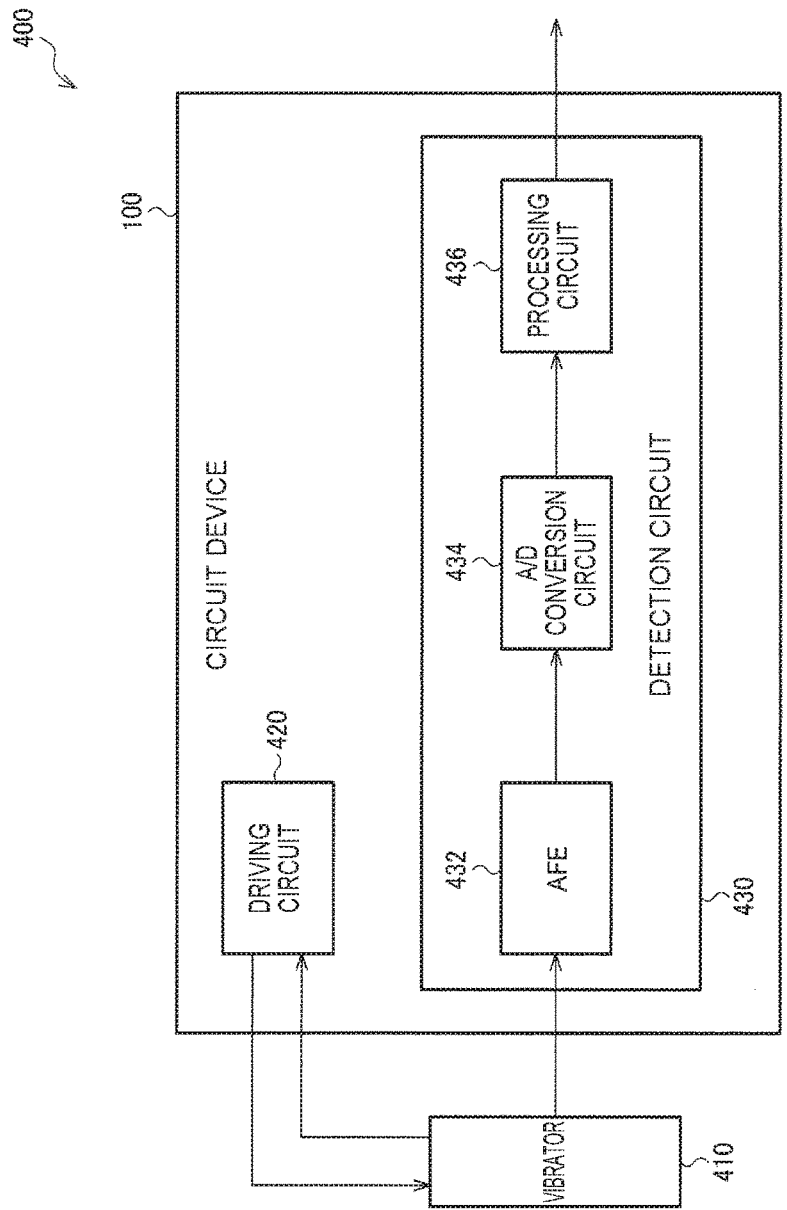
FIG. 19 shows a configuration example of a physical quantity sensor.

FIG. 19 is a configuration example of a physical quantity sensor 400 including the circuit device 100 of the embodiment. Here, a configuration example of a vibration gyro sensor (angular velocity sensor) is illustrated as an example of the physical quantity sensor 400. In addition, the physical quantity sensor 400 is not limited to this configuration, and the circuit device 100 of the embodiment can be applied to various physical quantity sensors such as a capacitance type (silicon MEMS type) gyro sensor, an acceleration sensor, a pressure sensor, and a temperature sensor.

The physical quantity sensor 400 includes a vibrator 410 (for example, a quartz vibrator) which is a detection element that detects the Coriolis force according to an angular velocity, and a circuit device 100 that drives the vibrator 410 and performs a process of detecting the angular velocity.

The circuit device 100 includes a driving circuit 420 and a detection circuit 430. The driving circuit 420 applies a driving signal of a sinusoidal wave or a rectangular wave to a driving vibration portion of the vibrator 410, and automatically adjusts the amplitude of the driving signal constantly based on the feedback signal from the driving vibration portion. The detection circuit 430 includes an analog front end circuit 432 (AFE), an A/D conversion circuit 434, and a processing circuit 436. The analog front end circuit 432 performs charge voltage conversion (Q/V conversion) on the detection signal from the vibrator 410, and synchronously detects the voltage to extract the angular velocity signal. The A/D conversion circuit 434 performs A/D conversion of the angular velocity signal into angular velocity data. The A/D conversion circuit 434 includes the comparator 50 of the embodiment, and corresponds to the sequential comparison type A/D conversion circuit described in FIG. 18. The processing circuit 436 performs various digital signal processes on the angular velocity data, and outputs the processed angular velocity data. For example, a temperature compensation process, a zero point correction process, a digital filter process, or like are performed as digital signal processes.

9. Electronic Device

Figure 20:
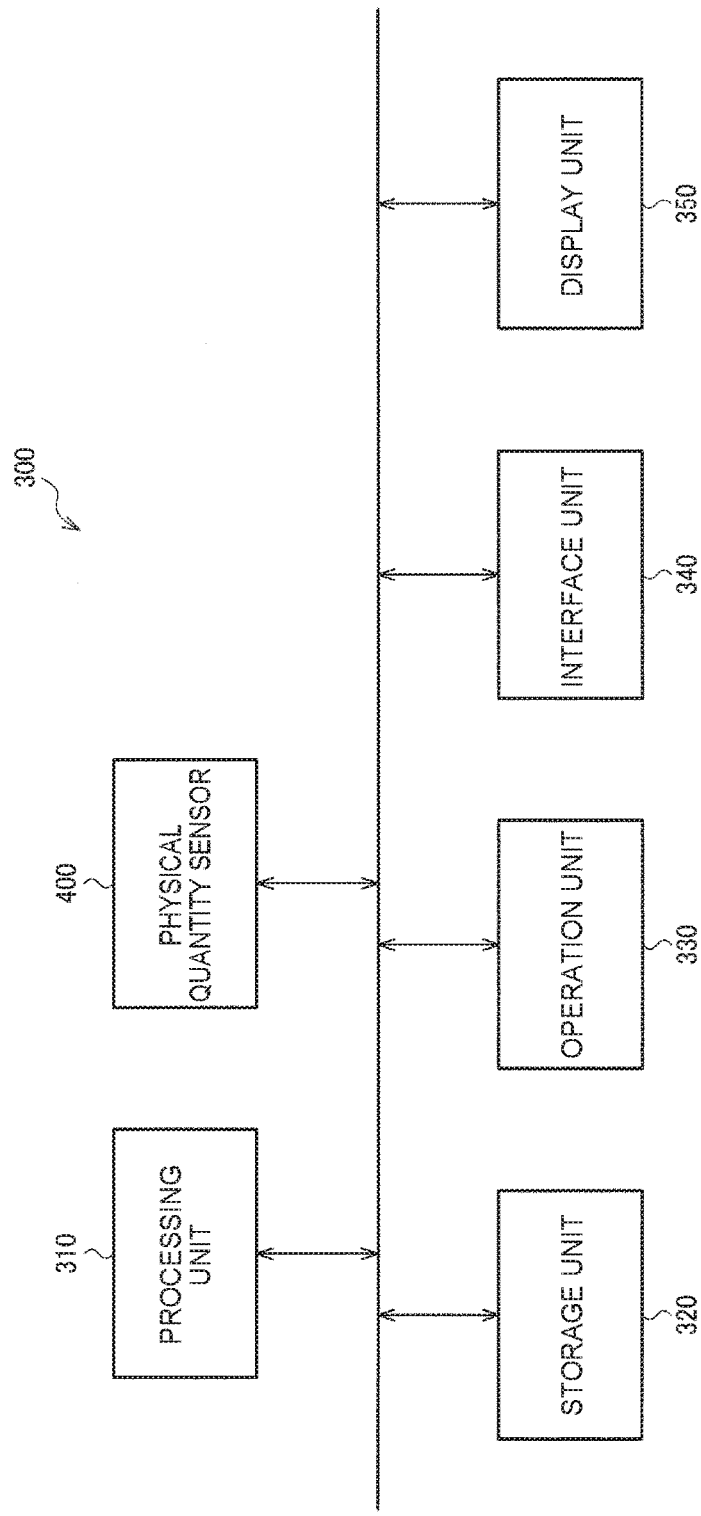
FIG. 20 shows a configuration example of an electronic device.
Figure 21:
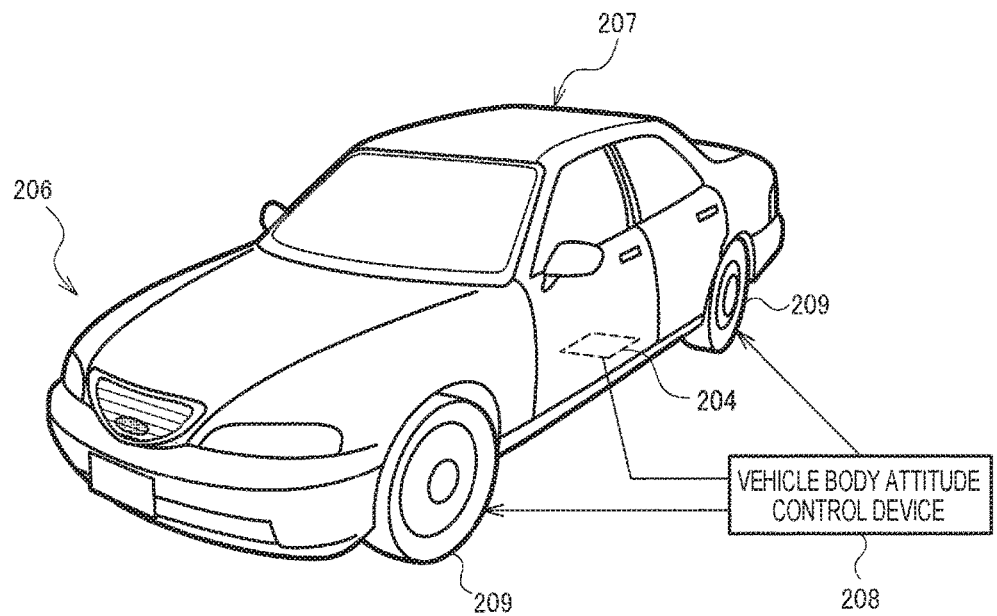
FIG. 21 schematically shows a vehicle as a specific example of a vehicle.

FIG. 20 and FIG. 21 are examples of an electronic device and a vehicle including the circuit device 100 of the embodiment. The circuit device 100 of the embodiment can be incorporated into, for example, various vehicles such as a car, an airplane, a motorbike, a bicycle, and a ship. A vehicle is, for example, equipment or a device that moves on the ground, the sky or the sea, equipped with a drive mechanism such as an engine or a motor, a steering mechanism such as a steering wheel or a rudder, and various electronic devices.

FIG. 20 is a configuration example of an electronic device 300. A digital still camera, a biometric information detection device (a wearable health device, for example, a pulsimeter, a pedometer, an activity meter, or the like), or a robot (a running robot, or a walking robot) can be assumed as a specific example of the electronic device 300. Here, the case where the electronic device 300 includes the physical quantity sensor 400 is described as an example, but the invention is not limited thereto. That is, the electronic device 300 may include the circuit device 100, and can be applied to various electronic devices in addition thereto.

The electronic device 300 includes a processing unit 310 (for example, a processor such as a CPU or a gate array), a storage unit 320 (for example, a memory, a hard disk, or the like), an operation unit 330 (an operation device), an interface unit 340 (an interface circuit or an interface device), a display unit 350 (display), and a physical quantity sensor 400.

The display unit 350 is, for example, a liquid crystal display device, or an electro-luminescence (EL) display device using a self-luminous element. The operation unit 330 is a user interface that accepts various operations from the user. For example, the operation unit 330 is a button, a mouse, a keyboard, a touch panel mounted on the display unit 350, or the like. The interface unit 340 is a data interface for inputting and outputting image data and control data. For example, the interface unit 340 is a wired communication interface such as USB, or a wireless communication interface such as a wireless LAN. The storage unit 320 stores data input from the interface unit 340. Alternatively, the storage unit 320 functions as a working memory of the processing unit 310. The physical quantity sensor 400 detects, for example, physical amounts such as an angular velocity and an acceleration, and outputs physical quantity data. The processing unit 310 performs a control process of various units in the electronic device and various data processes, based on the physical quantity data from the physical quantity sensor 400.

FIG. 21 is a diagram schematically illustrating a vehicle 206 as a specific example of the vehicle. A gyro sensor 204 (a physical quantity sensor) is incorporated into the vehicle 206. The gyro sensor 204 can detect the attitude of a vehicle body 207. The detection signal of the gyro sensor 204 is supplied to the vehicle body attitude control device 208. The vehicle body attitude control device 208 can control, for example, the hardness of the suspension and control the brakes of the individual wheels 209 according to the attitude of the vehicle body 207. In addition, such attitude control can be used in various vehicles such as a bipedal walking robot, an aircraft, or a helicopter. The gyro sensor 204 can be incorporated to realize attitude control.

Although the above embodiments are described in detail, it will be easily understood by those skilled in the art that many modifications can be made without practically departing from the novel matters and effects of the invention. Accordingly, all such modifications are included in the scope of the invention. For example, in the description or the drawings, the terms described together with the different terms which are broader or synonymous at least once can be replaced with the different terms anywhere in the description or the drawings. Further, all combinations of the embodiments and the modifications are included in the scope of the invention. The configurations and operations of the comparator, the circuit device, the physical quantity sensor, the electronic device, and the vehicle are not limited to those described in the embodiments, and various modifications can be made.

What is claimed is:

1. An A/D converter comprising:
    a comparator being configured to perform a comparison operation of input signals; and
    a control circuit being configured to set a conversion range,
    wherein the comparator includes
        a first voltage-time conversion circuit being configured to receive at least a first input signal and output a first time information signal,
        a second voltage-time conversion circuit being configured to receive at least a second input signal and output a second time information signal,
        a determination circuit being configured to determine a magnitude relation of the first input signal and the second input signal, based on the first time information signal from the first voltage-time conversion circuit, and the second time information signal from the second voltage-time conversion circuit, and
    wherein the control circuit sets the conversion range based on the first time information signal and the second time information signal.

2. The A/D converter according to claim 1, further comprising:
    a flag signal generation circuit being configured to generate a flag signal used for controlling the comparison operation,
    wherein the flag signal generation circuit generates the flag signal indicating that a voltage difference between the first input signal and the second input signal is a predetermined voltage or less, based on the first time information signal and the second time information signal.

3. The A/D converter according to claim 2,
the control circuit being configured to perform the comparison operation of the comparator a plurality of times in a case where the flag signal is active.

4. An electronic device comprising the A/D converter according to claim 3.

5. A physical quantity sensor comprising the A/D converter according to claim 3.

6. A vehicle comprising the A/D converter according to claim 3.

7. The A/D converter according to claim 2,
wherein the flag signal generation circuit being configured to generate the flag signal, based on the first time information signal, the second time information signal, a first delay signal obtained by delaying the first time information signal, and a second delay signal obtained by delaying the second time information signal.

8. A physical quantity sensor comprising the A/D converter according to claim 7.

9. An electronic device comprising the A/D converter according to claim 7.

10. The A/D converter according to claim 7,
wherein the flag signal generation circuit being configured to generate the flag signal, based on a first signal obtained by a logical product of the first time information signal and the second time information signal, and a second signal obtained by a logical sum of the first delay signal and the second delay signal.

11. The A/D converter according to claim 10,
wherein the flag signal generation circuit includes a latch circuit being configured to latche the first signal based on the second signal.

12. The A/D converter according to claim 10, further comprising:
a control circuit being configured to perform an end determination of the comparison operation of the comparator based on the second signal.

13. A physical quantity sensor comprising the A/D converter according to claim 2.

14. A vehicle comprising the A/D converter according to claim 2.

15. An electronic device comprising the A/D converter according to claim 2.

16. The A/D converter according to claim 1,
wherein the first voltage-time conversion circuit being configured to output the first time information signal corresponding to a first delay time that is increased as the voltage of the first input signal is larger than the voltage of the second input signal, and
wherein the second voltage-time conversion circuit outputs the second time information signal corresponding to a second delay time that is increased as the voltage of the second input signal is larger than the voltage of the first input signal.

17. The A/D converter according to claim 1,
wherein the predetermined voltage is a voltage corresponding to a dead zone of the comparison operation of the comparator.

18. An electronic device comprising the A/D converter according to claim 1.

19. A physical quantity sensor comprising the A/D converter according to claim 1.

20. A vehicle comprising the A/D converter according to claim 1.

* * * * *